(12) United States Patent
Yanagihara

(10) Patent No.: US 8,507,897 B2
(45) Date of Patent: Aug. 13, 2013

(54) ORGANIC EL ELEMENT HAVING A PARTITION WITH A STEP, METHOD FOR MANUFACTURING ORGANIC EL ELEMENT, ORGANIC EL DEVICE, AND ELECTRONIC APPARATUS

(75) Inventor: Hirokazu Yanagihara, Chino (JP)

(73) Assignee: Seiko Epson Corporation, Tokyo (JP)

( * ) Notice: Subject to any disclaimer, the term of this patent is extended or adjusted under 35 U.S.C. 154(b) by 120 days.

(21) Appl. No.: 12/943,346

(22) Filed: Nov. 10, 2010

(65) Prior Publication Data
US 2011/0108880 A1    May 12, 2011

(30) Foreign Application Priority Data

Nov. 11, 2009   (JP) .................................. 2009-257715

(51) Int. Cl.
*H01L 29/08*     (2006.01)
*H01L 35/24*     (2006.01)
*H01L 51/00*     (2006.01)

(52) U.S. Cl.
USPC .......... 257/40; 257/59; 257/72; 257/E51.002; 257/E21.299; 438/99; 438/780; 313/500; 313/504; 313/505

(58) Field of Classification Search
USPC .................................. 257/E51.001–E51.002
See application file for complete search history.

(56) References Cited

U.S. PATENT DOCUMENTS

| 6,476,988 B1 | 11/2002 | Yudasaka |
| 2008/0063949 A1* | 3/2008 | Inoue ................................ 430/5 |
| 2009/0020751 A1* | 1/2009 | Seki et al. ........................ 257/40 |

FOREIGN PATENT DOCUMENTS

| JP | A-11-271753 | 10/1999 |
| JP | A-2008-135255 | 6/2008 |
| WO | WO 2009113239 A1 * | 9/2009 |

* cited by examiner

*Primary Examiner* — Marcos D. Pizarro
*Assistant Examiner* — Cesar Lopez
(74) *Attorney, Agent, or Firm* — Oliff & Berridge, PLC

(57) ABSTRACT

An organic EL element includes a functional layer disposed between an anode and a cathode on a substrate and including laminated different organic thin films including a light-emitting layer, and a partition wall which defines the functional layer. Each of the organic thin films is formed by applying a liquid containing a functional layer-forming material on a film-forming region defined by the partition wall and then drying the liquid. The partition wall has at least one step portion provided in the side wall thereof in the thickness direction, and liquid repellency is imparted to the uppermost surface of the partition wall and the upper surface of the step portion. The surface of the side wall excluding the step portion has lyophilicity in comparison with the upper surface of the step portion.

10 Claims, 16 Drawing Sheets

ORGANIC EL ELEMENT HAVING A PARTITION WITH A STEP, METHOD FOR MANUFACTURING ORGANIC EL ELEMENT, ORGANIC EL DEVICE, AND ELECTRONIC APPARATUS

BACKGROUND

1. Technical Field

The present invention relates to an organic EL (electroluminescence) element, a method for manufacturing an organic EL element, an organic EL device, and an electronic apparatus.

2. Related Art

An example of a method for manufacturing an organic EL element is disclosed, in which a functional layer including a light-emitting layer of an organic EL element is formed by a thin-film forming method of forming a thin-film layer by filling a region surrounded by a bank (partition wall) with a thin-film material solution (Japanese Unexamined Patent Application Publication. Nos. 11-271753 and 2008-135255).

Japanese Unexamined Patent Application Publication No. 11-271753 discloses an example in which a functional layer includes a hole transport layer and an organic semiconductor layer (light-emitting layer). The bank has a laminated structure including an affinity layer showing affinity for the thin-film material solution (containing a hole transport layer material or an organic semiconductor material) and a non-affinity layer showing non-affinity for the material. The laminated structure is formed by repeatedly laminating layers a number of times corresponding to the number of different material layers in the functional layer. The thickness of the lowermost affinity layer is substantially the same as the thickness of a thin film to be formed by drying the thin-film material solution. The total thickness of the lowermost affinity layer and the non-affinity layer laminated on the affinity layer is substantially the same as the thickness of a next thin film to be laminated.

Namely, a thin film formed by drying the thin-film material solution applied inside the bank is pinned by the side wall of the corresponding affinity layer, not by the non-affinity layer. Therefore, a thin film having a stable sectional shape and a laminated structure thereof can be realized.

Japanese Unexamined Patent Application Publication No. 2008-135255 discloses that an insulating individual partition wall which partitions pixel apertures of a plurality of organic EL elements disposed on a substrate, and a common partition wall formed around the individual partition wall with a space therebetween are provided. The common partition is made of a liquid-repellent material, and a liquid containing a light-emitting layer-forming material is applied to a region surrounded by the common partition and dried to dispose a light-emitting layer to cover the individual partition. As a result, the thicknesses of light-emitting layers in a plurality of organic EL elements are made more uniform. The individual partition may be formed by laminating a lyophilic layer and a liquid-repellent layer.

In the configuration of the bank of Japanese Unexamined Patent Application Publication No. 11-271753, when a next thin film is laminated on the lowermost thin film layer, the thin film is not securely pinned by the affinity layer on the non-affinity layer in a drying process unless the thin-film material solution is filled over the non-affinity layer in the height direction. That is, in fact, there is a problem that it is difficult to form each of the layers in the laminated structure-functional layer at a desired position in the height direction unless a region surrounded by the bank is uniformly filled with a predetermined amount of the thin-film material solution.

The configuration including the individual partition wall and the common partition wall described in Japanese Unexamined Patent Application Publication No. 2008-135255 is effective in forming a plurality of organic EL elements which produce a single luminescent color but is unsuitable for generating different luminescent colors between adjacent organic EL elements. This configuration also has the problem of being unsuitable for a display device and the like which are aimed at securing a predetermined numerical aperture because the size and arrangement of a light-emitting region defined by the individual partition wall are limited by an arrangement relation to the common partition wall.

SUMMARY

An advantage of some aspects of the invention is that the invention provides an organic EL element including a functional layer disposed between an anode and a cathode on a substrate and including laminated different organic thin films including a light-emitting layer, and a partition wall which defines the functional layer. Each of the organic thin films is formed by applying a liquid containing a functional layer-forming material on a film-forming region defined by the partition wall and then drying the liquid. The partition wall has at least one step portion provided in the side wall thereof in the thickness direction, liquid repellency is imparted to the uppermost surface of the partition wall and the upper surface of the step portion, and the surface of the side wall excluding the step portion has lyophilicity in comparison with the upper surface of the step portion.

In this configuration, the step portion provided in the side wall of the partition wall serves as a measure for filling the film-forming region with the liquid. In addition, liquid repellency is imparted to the upper surface of the step portion, and the side wall has lyophilicity at the lower and upper sides of the step portion in comparison with the upper surface of the step portion. Therefore, a pinning position of the liquid can be securely separated into positions holding the step portion therebetween. Therefore, different organic thin films with stable sectional shapes after deposition can be formed on the lower and upper sides of the step portion to hold the step portion therebetween. That is, it is possible to provide an organic EL element including a functional layer having lower luminance variation and including different organic thin films with stable sectional shapes.

In the above-described organic EL element, the upper surface of the step portion preferably has lower liquid repellency than that of the uppermost surface of the partition wall.

In this configuration, when the liquid is applied to the film-forming region in order to form a next organic thin film on an organic thin film formed on the lower side of the step portion, the liquid can be relatively easily applied over the upper surface of the step portion having liquid repellency and thus can be uniformly filled. Namely, the cross-sectional shape of the next organic thin film can be made more stable.

In the above-described organic EL element, the partition wall may include a first partition wall and a second partition wall provided on the first partition wall to be narrower than the first partition wall. In addition, the step portion may be formed using the first partition wall and the second partition wall, and liquid repellency may be imparted to the upper surfaces of the first partition wall and the second partition wall.

In this configuration, the partition wall is provided to be divided into the first partition wall constituting the lower layer side and the second partition wall constituting the upper layer side, and thus the step portion having the liquid-repellent upper surface can be easily formed.

In the above-described organic EL element, the partition wall may include a structure provided to surround the of the anode on the substrate, first partition walls provided inside and outside of the structure to hold the structure therebetween, and a second partition wall provided on the structure. In addition, the step portion may be formed using the first partition walls and the second partition wall, and liquid repellency may be imparted to the upper surfaces of the first partition walls and the second partition wall.

In this configuration, the second partition wall is provided on the structure on the substrate by utilizing the structure, and thus the step portion can be formed without producing a useless space as compared with a case in which the partition wall is provided avoiding the structure.

As the structure, a laminate of wirings provided on the substrate to surround the anode, a semiconductor layer used for a switching element and a storage capacitor which constitute a driving circuit of the organic EL element, and an insulating film which covers the wirings and the semiconductor layer may be used.

In the above-described organic EL element, the partition wall may include a structure provided to surround the periphery of the anode on the substrate and first partition walls provided inside and outside of the structure to hold the structure therebetween and have a lower height than the structure. In addition, the step portion may be formed using the structure and the first partition walls, and liquid repellency may be imparted to the upper surfaces of the structure and the first partition walls.

In this configuration, the step portion can be formed positively using the structure as a portion of the partition wall together with the first partition wall. In other words, a second partition wall need not be provided on the structure, thereby simplifying the configuration of the partition wall.

In the above-described organic EL element, the partition wall may include a structure provided to surround the periphery of the anode on the substrate and a second partition wall provided on the structure. In addition, the step portion may be formed using the structure and the second partition wall, and liquid repellency may be imparted to the upper surface of the second partition wall and the exposed upper surface of the structure.

In this configuration, the step portion is formed using the structure and the second partition wall provided on the structure, thereby simplifying the configuration of the partition wall in comparison with the case in which the first partition wall is provided.

In the above-described organic EL element, the partition wall may include a structure provided to surround the periphery of the anode on the substrate, first partition walls provided inside and outside of the structure to hold the structure therebetween and have a lower height than the structure, and a second partition wall provided on the structure. In addition, the step portion may be formed using the structure, the first partition walls, and the second partition wall, and liquid repellency may be imparted to the upper surfaces of the first partition walls and the second partition wall.

As described above, the structure provided on the substrate is mainly composed of an inorganic material and thus easily exhibits lyophilicity for the liquid. In this configuration, the structure exhibiting lyophilicity is exposed between the first partition wall and the second partition wall on the substrate $1n$ the height direction. Therefore, when the film-forming region is filled with the liquid over the first partition wall, the liquid is easily pinned by the exposed surface of the structure. In other words, an organic thin film can be formed at a stable position on the substrate $1n$ the height direction.

In the above-described organic EL element, the partition wall may include a structure provided to surround the periphery of the anode on the substrate, and at least one step portion provided in the side wall of the partition wall in the thickness direction. In addition, liquid repellency may be imparted to the uppermost surface of the partition wall and the upper surface of the step portion.

In this configuration, the partition wall includes the structure and the step portion provided on the side wall. In particular, when the structure is three-dimensionally small, a partition wall at a desired height can be formed by including the structure without difficulty.

An advantage of some aspects of the invention is that the invention provides a method for manufacturing an organic EL element including a functional layer disposed between an anode and a cathode on a substrate and including laminated different organic thin films including a light-emitting layer. The method includes forming a first partition wall which defines the anode and has an upper surface with liquid repellency; forming, on the first partition wall, a second partition wall which has an upper surface with liquid repellency and a narrower width than the first partition wall; forming the functional layer by forming each of the organic thin films by applying a liquid containing a functional layer-forming material on a film-forming region which is defined by a partition wall including the first partition wall and the second partition wall and then drying the liquid; and forming the cathode on the functional layer.

In this method, a step portion is formed in the side wall of the partition wall which defines the film-forming region by the first partition wall and the second partition wall. The step portion serves as a measure for filling the film-forming region with the functional layer-forming material in order to form the functional layer. In addition, since the upper surface of the first partition wall has liquid repellency, a pinning position of the liquid can be separated into lower and upper positions holing the upper surface of the first partition therebetween. Therefore, the different organic thin films can be formed below and above the upper surface to hold the upper surface therebetween and to have stable sectional shapes after deposition. In other words, it is possible to manufacture an organic EL element having lower luminance variation and including a functional layer including different organic thin films with stable sectional shapes.

In the above-described method for manufacturing an organic EL element, each of the first partition wall and the second partition wall is formed by forming a coating film on the substrate using a photosensitive resin material containing a liquid-repellent agent, heat-treating the coating film, and then patterning the heat-treated coating film.

In this method, the liquid-repellent agent contained in the coating film has the property of thermally diffusing to a surface layer by heating, and thus liquid repellency can be stably imparted as compared with a method of imparting liquid repellency to a partition wall composed of an organic material using a fluorine-based treatment gas. In addition, since each of the first partition wall and the second partition wall is formed by patterning the coating film after heating, liquid repellency can be imparted to the upper surface of each of the partition walls, and liquid repellency of the side wall of each of the partition walls can be made lower than that of the upper surface. Therefore, the upper surface and the side wall can be made to have different wettabilities with the liquid.

In the above-described method for manufacturing an organic EL element, the first partition wall is preferably formed using the liquid-repellent agent contained in the coating film in an amount smaller than that of the second partition wall.

In this method, the liquid-repellency of the first partition wall is lower than that of the second partition wall. Therefore, when the liquid is applied to the film-forming region in order to further form a next organic thin film on an organic thin film formed on the lower side of the first partition wall, the liquid ban be relatively easily applied over the upper surface of the first partition wall with liquid repellency, thereby permitting uniform filling of the liquid. Namely, a next organic thin film to be formed can be formed to have a stable sectional shape.

In the above-described method for manufacturing an organic EL element, the second partition wall may be formed by patterning a photosensitive resin material to the second partition wall on the first partition wall and transferring a liquid-repellent layer to the upper surface of the second partition wall.

In this method, the method for imparting liquid repellency to the first partition wall is changed for the second partition wall, and thus liquid repellency to be imparted can be relatively easily changed. For example, the liquid repellency of the first partition wall can be easily made lower than that of the second partition wall.

In addition, a heat treatment is not required, thereby contributing energy saving as compared with the case in which the second partition wall is formed using a photosensitive resin material containing a liquid-repellent agent.

In the above-described method for manufacturing an organic EL element, the first partition walls may be formed inside and outside a structure to hold the structure therebetween, the structure being provided to surround the periphery of the anode on the substrate, and the second partition wall may be formed on the structure.

In this method, the second partition wall is provided on the structure on the substrate, and thus the partition wall can be formed without producing a useless space as compared with the case in which the partition wall is provided avoiding the structure.

An advantage of some aspects of the invention is that the invention provides a method for manufacturing an organic EL element including a functional layer disposed between an anode and a cathode on a substrate and including laminated different organic thin films including a light-emitting layer, and a structure provided to surround the periphery of the anode. The method includes forming first partition walls inside and outside the structure to hold the structure therebetween and to have a lower height than the structure, imparting liquid repellency to the upper surfaces of the first partition walls and the upper surface of the structure, forming the functional layer by forming each of the organic thin films by applying a liquid containing a functional layer-forming material on a film-forming region which is defined by a partition wall including the first partition walls and the structure and then drying the liquid, and forming the cathode on the functional layer.

In this method, a step portion can be formed by positively using the structure as a portion of the partition wall together with the first partition wall. In other words, a second partition wall need not be formed, thereby simplifying the formation of the partition wall.

An advantage of some aspects of the invention is that the invention provides a method for manufacturing an organic EL element including a functional layer disposed between an anode and a cathode on a substrate and including laminated different organic thin films including a light-emitting layer, and a structure provided to surround the periphery of the anode. The method includes forming a second partition wall on the structure, imparting liquid repellency to the upper surface of the second partition wall and the upper surface of the structure, forming the functional layer by forming each of the organic thin films by applying a liquid containing a functional layer-forming material in a film-forming region which is defined by a partition wall including the structure and the second partition wall and then drying the liquid, and forming the cathode on the functional layer.

In this method, a step portion can be formed by using the structure and the second partition wall formed on the structure. In other words, a first partition wall need not be formed, thereby simplifying the formation of the partition wall.

An advantage of some aspects of the invention is that the invention provides a method for manufacturing an organic EL element including a functional layer disposed between an anode and a cathode on a substrate and including laminated different organic thin films including a light-emitting layer, and a structure provided to surround the periphery of the anode. The method includes forming first partition walls inside and outside the structure to hold the structure therebetween and to have a lower height than the structure, forming a second partition wall on the structure, imparting liquid repellency to the upper surfaces of the first partition walls and the upper surface of the second partition wall, forming the functional layer by forming each of the organic thin films by applying a liquid containing a functional layer-forming material on a film-forming region which is defined by a partition wall including the first partition walls, the structure, and the second partition wall and then drying the liquid, and forming the cathode on the functional layer.

In this method, the structure showing lyophilicity is exposed between the first partition walls and the second partition wall on the substrate $1n$ the height direction. Therefore, when the film-forming region is filled with the liquid over the first partition walls, the liquid is pinned by the exposed surface of the structure. In other words, an organic thin film can be formed at a stable position on the substrate $1n$ the height direction.

In the above-described method for manufacturing an organic EL element, liquid repellency may be imparted by transferring a liquid-repellent layer to the upper surfaces.

In this method, the liquid-repellent layers can be selectively and substantially simultaneously formed on the uppermost surface, i.e., the top surface, of the partition wall and the upper surface of the step portion.

In the above-described method for manufacturing an organic EL element, the first partition wall may be formed by forming a coating film on the substrate using a photosensitive resin material containing a liquid-repellent agent, heat-treating the coating film, and then patterning the heat-treated coating film.

In this method, liquid repellency can be securely imparted to the upper surface of the first partition wall which is lower than the height of the structure.

An advantage of some aspects of the invention is that the invention provides a method for manufacturing an organic EL element including a functional layer disposed between an anode and a cathode on a substrate and including laminated different organic thin films including a light-emitting layer, and a structure provided to surround the periphery of the anode. The method includes forming a partition wall which defines the anode and which three-dimensionally includes the structure and has a top higher than the structure and a step portion provided in the side wall between the top and the structure, imparting liquid repellency to the top of the partition wall and the upper surface of the step portion, forming the functional layer by forming each of the organic thin films by applying a liquid containing a functional layer-forming material on a film-forming region which is defined by the partition wall and then drying the liquid, and forming the cathode on the functional layer.

In this method, the step portion can be formed in the side wall of the partition wall by including the structure and utilizing the height thereof, and the partition wall having a desired height can be formed. In addition, the step portion serves as a measure for filling the film-forming region with the liquid. Further, since the upper surface of the step portion has liquid repellency, a pinning position of the liquid can be securely separated into lower and upper positions holding the upper surface of the step portion therebetween. Therefore, different organic thin films having stable sectional shapes after deposition can be formed below and above the upper surface of the step portion to hold the upper surface therebetween. Namely, an organic EL element having lower luminance variation and including a functional layer including different organic thin films having stable sectional shapes can be manufactured.

In the above-described method for manufacturing an organic EL element, liquid repellency may be imparted by transferring liquid-repellent layers to the top of the partition wall and the upper surface of the step portion.

In this method, the liquid-repellent layers can be substantially simultaneously formed on the top of the partition wall and the upper surface of the step portion.

An advantage of some aspects of the invention is that the invention provides an organic EL device including the above-described organic EL element or an organic EL element manufactured using the above-described method for manufacturing an organic EL element.

In this configuration, an organic EL device capable of achieving stable light emission characteristics can be provided because the device includes an organic EL element having lower luminance variation.

An advantage of some aspects of the invention is that the invention provides an electronic apparatus including the above-described organic EL device.

In this configuration, for example, when an organic EL device is used as a display portion, an electronic apparatus capable of good-looking display can be provided because an organic EL device having stable light emission characteristics is provided.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiments of the present invention are described below with reference to the drawings. The drawings used are appropriately enlarged or contracted so that a portion to be described becomes recognizable.

First Embodiment

Organic EL Device

Figure 1:
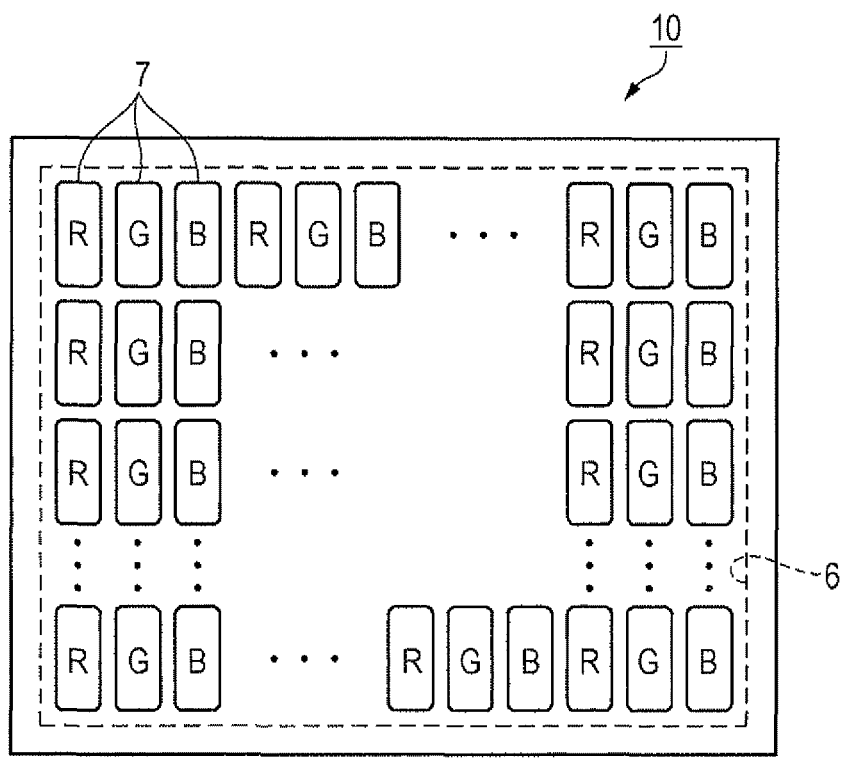
FIG. 1 is a schematic front view showing a configuration of an organic EL device.
Figure 2:
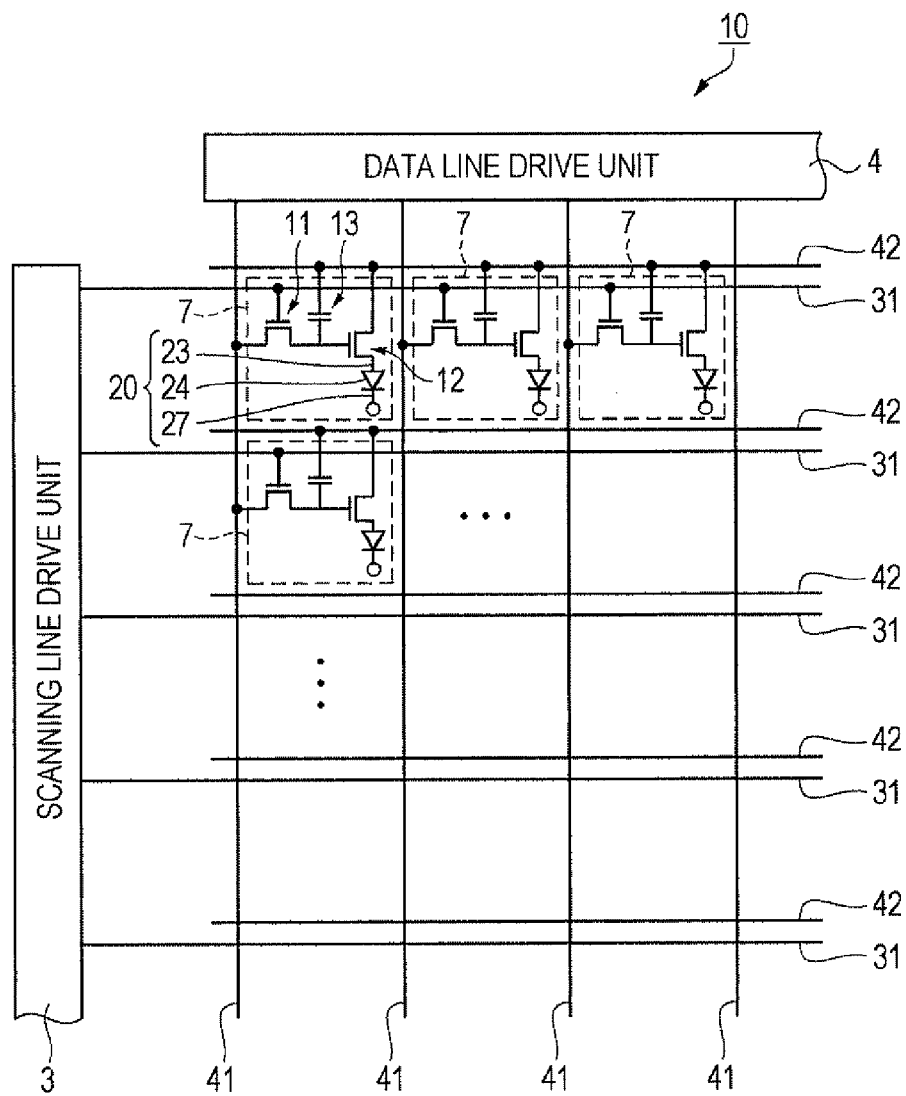
FIG. 2 is an equivalent circuit diagram showing an electric configuration of an organic EL device.
Figure 3:
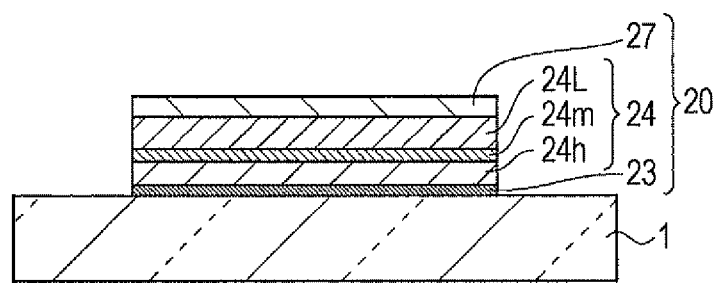
FIG. 3 is a schematic view showing a configuration of an organic EL element.

An organic EL device including an organic EL (Electroluminescence) element according to this embodiment is described with reference to FIGS. 1 to 3. FIG. 1 is a schematic front view showing a configuration of an organic EL device. FIG. 2 is an equivalent circuit diagram showing an electric configuration of an organic EL device. FIG. 3 is a schematic view showing a configuration of an organic EL element.

As shown in FIG. 1, an organic EL device 10 according to this embodiment includes light-emitting pixels 7 which emit lights (luminescent color) of red (R), green (G), and blue (B). The light-emitting pixels 7 have a substantially rectangular shape and are arranged in a matrix in a light-emitting region (display region) 6. The light-emitting pixels 7 which emit lights of the same color are arrayed in a vertical direction (column direction or longitudinal direction of light-emitting pixels) on the drawing. The light-emitting pixels 7 which emit lights of different colors are arrayed in the order of R, G, and B in a horizontal direction (row direction or transverse direction of light-emitting pixels) on the drawing. Namely, the light-emitting pixels 7 which emit lights of different colors are arranged in a so-called stripe form. The planar shape and arrangement of the light-emitting pixels 7 which emit lights of different colors are not limited to this.

If the organic EL device 10 is used as a display device, the light-emitting pixels 7 are electrically controlled in such a manner that the three light-emitting pixels 7 which emit different luminescent colors are regarded as one display pixel unit. This permits full-color display.

As shown in FIG. 2, the organic EL device 10 is an active matrix-type organic EL device using a thin-film transistor (abbreviated as "TFT" hereinafter) as a switching element which drives each of the light-emitting pixels 7.

The organic EL device 10 is provided with a plurality of scanning lines 31 connected to a scanning line driving section 3, a plurality of data lines 41 connected to a data line driving section 4, and a plurality of power supply lines 42 provided in parallel to the respective scanning lines 31. The light emission of the light-emitting pixels 7 is controlled by driving circuit portions provided corresponding to the respective regions defined by the scanning lines 31 and the data lines 41 which cross each other and which are insulated from each other.

Each of the driving circuit portions is provided with switching TFT 11 in which a scan signal is supplied to a gate electrode through the corresponding scanning line 31, a storage capacitor 13 which stores a pixel signal supplied from the corresponding data line 41 through the TFT 11, and driving TFT 12 in which the pixel signal held in the storage capacitor 13 is supplied to a gate electrode. Further, each of the driving circuit portions includes a pixel electrode 23 serving as an anode to which a driving current flows from the corresponding power supply line 42 when electrically connected to the power supply line 42 through the driving TFT 12, and a functional layer 24 sandwiched between the pixel electrode 23 and a common electrode 27 serving as a cathode.

When the switching TFT 11 is turned on by driving the corresponding scanning line 31, the potential of the corresponding data line 41 is stored in the storage capacitor 13, and an on/off state of the driving TFT 12 is determined according to the state of the storage capacitor 13. In addition, a current flows into the pixel electrode 23 from the corresponding power supply line 42 through the driving TFT 12. Further, the current flows to a common electrode 27 through the functional layer 24. The functional layer 24 emits light according to the quantity of the current flowing therethrough. That is, the pixel electrode 23, the common electrode 27, and the functional layer 24 constitute an organic EL element 20 as a light emission unit. The configuration of the driving circuit portions is not limited to this, and for example, three or more thin-film transistors may be provided.

As shown in FIG. 3, the organic EL element 20 is provided on an element substrate 1 used as a substrate 1n which the driving circuit portions (not shown) are formed. The functional layer 24 is disposed between the pixel electrode 23 and the common electrode 27 on the element substrate 1. In the embodiment, the functional layer 24 includes a hole injection layer 24h, an intermediate layer 24m and a light-emitting layer 24L which are different organic thin films and are laminated in order.

In the embodiment, the functional layer 24 is formed by applying a liquid containing a functional layer-forming material to a film-forming region including the pixel electrode 23 and then drying the liquid. In order to achieve stable light emission with small luminance variation in the functional layer 24, it is important to form each of the organic thin films having a sectional shape without nonuniformity. In particular, when the sectional shape of the light-emitting layer 24L has nonuniformity, i.e., nonuniformity of thickness, the electric resistance of a portion having a smaller thickness is decreased, and the current flowing through this portion is increased, thereby causing nonuniformity of luminance. Alternatively, the emission life of the light-emitting layer 24L may be shortened.

Figure 19A:
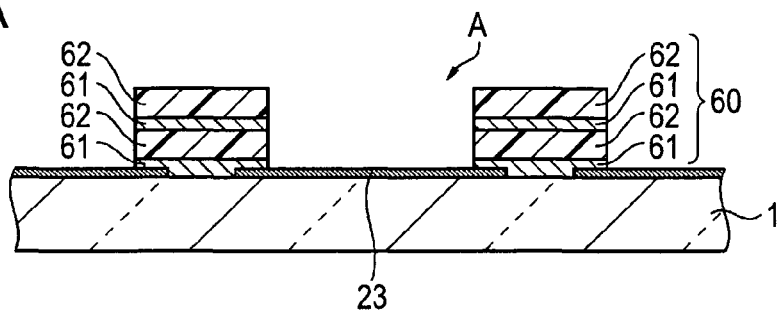
FIGS. 19A to 19E are schematic sectional views illustrating a structure of a conventional organic EL element and a method for forming a functional layer.

FIGS. 19A to 19E are schematic sectional views illustrating a structure of a conventional organic EL element and a method for forming a functional layer. In Japanese Unexamined Patent Application Publication No. 11-271753, as shown in FIG. 19A, a film-forming region A in which a functional layer is formed is defined by providing a partition wall 60 to surround a pixel electrode 23. The partition wall 60 is formed by laminating in order an affinity layer 61 showing affinity (lyophilicity) for a liquid containing a functional layer-forming material and a non-affinity layer 62 showing non-affinity (liquid repellency) for the liquid. Specifically, the affinity layer 61 is formed using an inorganic material such as $SiO_2$ or the like which exhibits affinity, while the non-affinity layer 62 is formed using an organic material such as resist or the like which exhibits non-affinity.

Figure 19B:
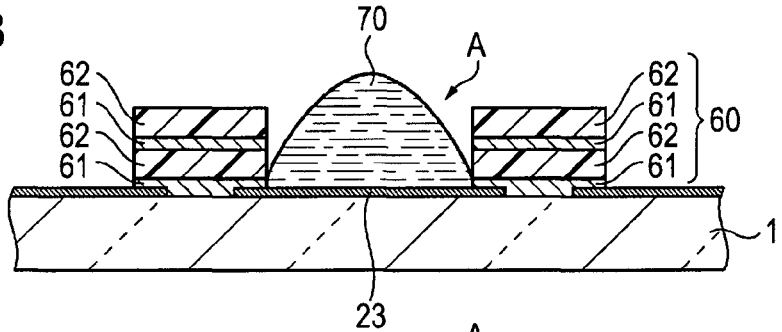
Figure 19C:
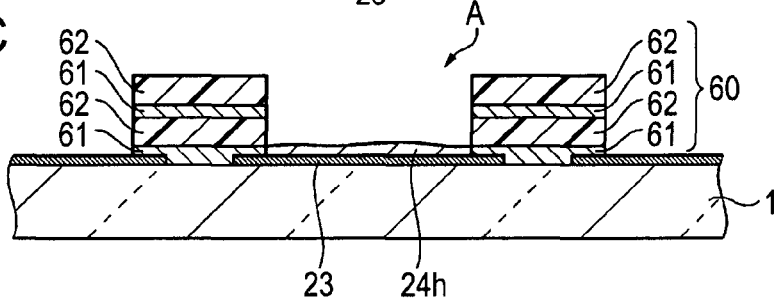

When first, a liquid 70 is applied to the film-forming region A defined by the partition wall 60 as shown in FIG. 19B, the liquid 70 is attracted to (wets) the side wall of the affinity layer 61 but is not attracted to (repelled by) the side wall of the non-affinity layer 62. Therefore, as shown in FIG. 19C, for example, the hole injection layer 24h having a stable sectional shape and pinned by the side wall of the affinity layer 61 is formed after drying the liquid 70. Even when a next organic thin film is laminated on the hole injection layer 24h, the same operation and advantage as described above can be achieved.

Figure 19D:
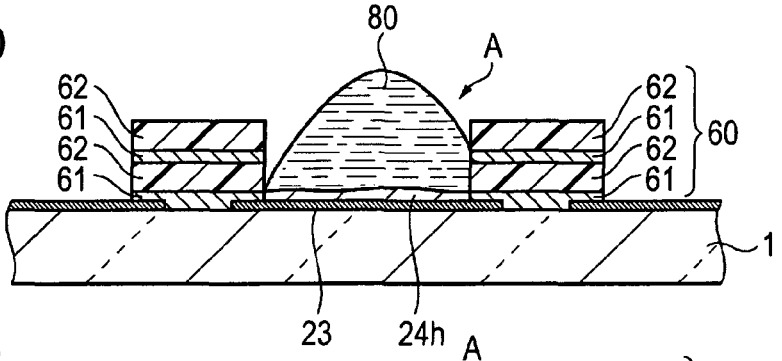
Figure 19E:
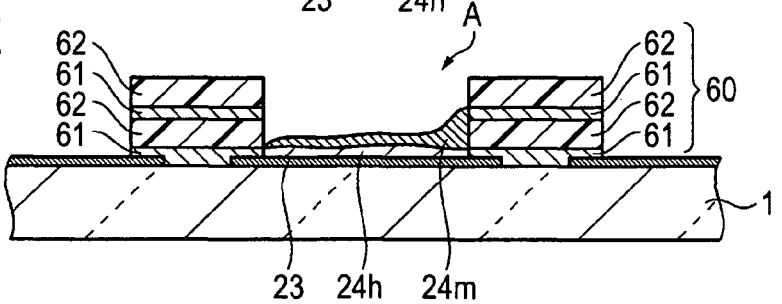

However, as shown in FIG. 19D, when the film-forming region A is filled with a next liquid 80, one of the ends is pinned by the next affinity layer 61 after drying, but the other end does not reach the next affinity layer 61 as shown in FIG. 19E unless the liquid 80 is filled so as to contact the next affinity layer 61 over the non-affinity layer 62.

Japanese Unexamined Patent Application Publication No. 11-271753 discloses a technique for further increasing a contact angle of the liquid with a bank-forming surface (i.e., the side wall) of the non-affinity layer 62 by surface-treating the partition wall 60 with a fluorine-based treatment gas. However, such surface treatment may make it more difficult for the liquid 80 to pass over the non-affinity layer 62, thereby causing difficulty in reaching the next affinity layer 61. Further, when the partition wall 60 formed by laminating the affinity layer 61 and the non-affinity layer 62 is a substantially plane side wall, the difficulty is increased. Namely, it is very difficult to laminate different organic thin films with stable sectional shapes.

Therefore, the inventors have developed a structure of an organic EL element 20 in which each of different organic thin films can be formed with a stable sectional shape by a method of applying a liquid in consideration of a configuration of a partition wall, which defines the film-forming region A, and a method for imparting liquid repellency or lyophilicity to a surface of the partition wall, and also developed a method for manufacturing the organic EL element 20. The present invention is described by giving examples.

Example 1

Figure 4:
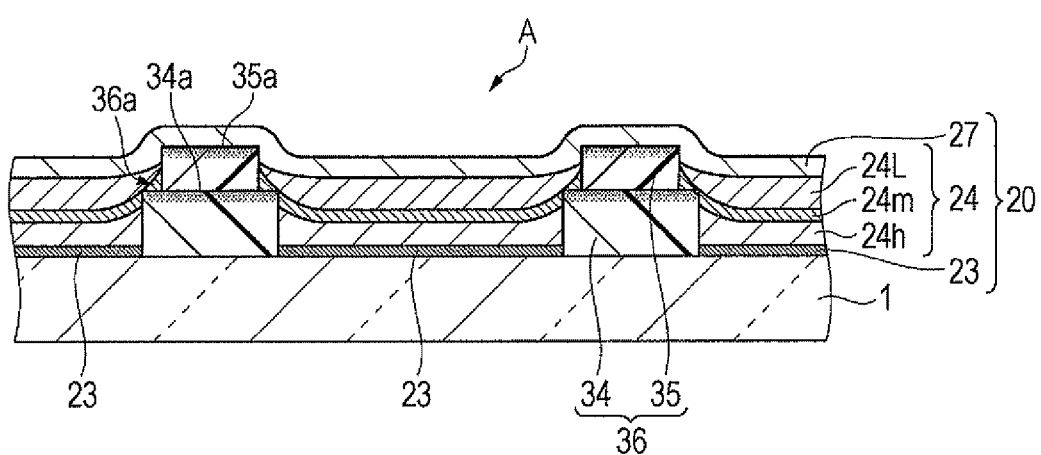
FIG. 4 is a schematic sectional view showing a structure of an organic EL element of Example 1.
Figure 5:
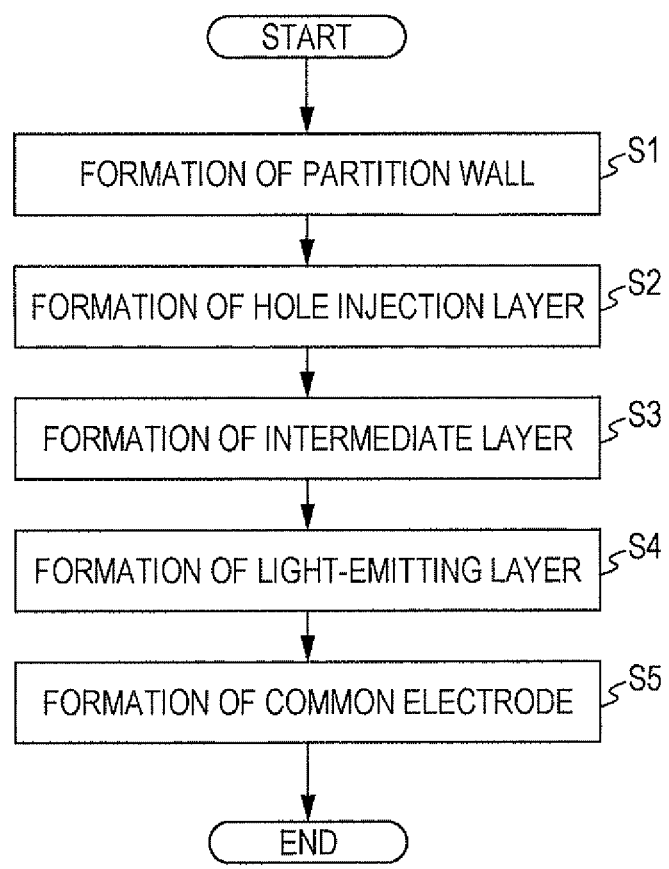
FIG. 5 is a flow chart showing a method for manufacturing an organic EL element of Example 1.

FIG. 4 is a schematic sectional view showing a structure of an organic EL element of Example 1. FIG. 5 is a flow chart showing a method for manufacturing the organic EL element of Example 1. FIGS. 6A to 6F and FIGS. 7G to 7K are schematic sectional views showing a method for manufacturing the organic EL element of Example 1.

As shown in FIG. 4, an organic EL element 20 of Example 1 includes a partition wall 36 which defines a pixel electrode 23 provided on an element substrate 1, a functional layer 24 provided in a film-forming region A defined by the partition wall 36, and a common electrode 27 provided to cover the functional layer 24 and the partition wall 36.

As the element substrate 1, a transparent glass or plastic substrate is used.

The pixel electrode 23 is formed using a transparent conductive film of ITO (Indium Tin Oxide) or the like, and the common electrode 27 is formed using a metallic material with reflectivity, such as opaque Al (aluminum) or the like. Namely, the organic EL element 20 is a bottom emission type in which light emitted from the functional layer 24 is reflected by the common electrode 27 and output from the element substrate 1 side.

The partition wall 36 includes a first partition wall 34 and a second partition wall 35 provided on the first partition wall 34 to be narrower than the first partition wall 34. A step portion 36a is formed using the first partition wall 34 and the second partition wall 35.

The upper surface 34a of the first partition wall 34 and the upper surface 35a of the second partition wall 35 are imparted with liquid repellency. In addition, the upper surface 34a of the first partition wall 34 has lower liquid repellency than that of the upper surface 35a of the second partition wall 35.

The partition wall 36 has the step portion 36a in the side wall thereof in a sectional shape. The upper surface 34a is substantially parallel to the surface of the element substrate 1 and has lower liquid repellency than the top of the partition wall 36. The liquid repellency is imparted to the top and the upper surface 34a of the step portion 36a. The side wall of the partition wall 36 shows lower liquid repellency (in other words, lyophilicity) for a liquid at the lower and upper sides of the step portion 36a disposed therebetween as compared with the upper surface 34a of the step portion 36a. The top of the partition wall 36 corresponds to the upper surface 35a of the second partition wall 35 and thus may be referred to as the "top 35a" hereinafter.

As shown in FIG. 5, the method for manufacturing the organic EL element 20 includes forming the partition wall 36 (Step S1), forming the hole injection layer 24h on the pixel electrode 23 (Step S2), forming the intermediate layer 24m on the hole injection layer 24h (Step S3), forming the light-emitting layer 24L on the intermediate layer 24m (Step S4), and forming the common electrode 27 to cover the light-emitting layer 24L (Step S5). Steps S2 to S4 correspond to a functional layer forming step.

Figure 6A:
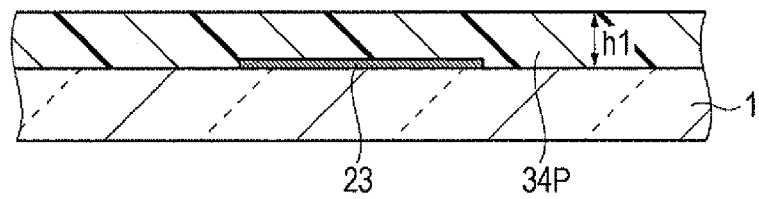
FIGS. 6A to 6F are schematic sectional views showing a method for manufacturing an organic EL element of Example 1.

In Step S1 of forming the partition wall, as shown in FIG. 6A, a coating film 34P is formed using a photosensitive resin material containing a liquid-repellent agent to cover the side of the element substrate 1 on which the pixel electrode 23 is provided. The thickness $h_1$ of the coating film 34P is about 2 µm. A method for forming the coating film 34P includes uniformly applying a liquid photosensitive resin material by a spin coating method or a roll coating method and then drying the liquid material.

Examples of the photosensitive resin material include phenol, epoxy, and polyimide resist materials. In addition, for example, a fluorine compound is used as the liquid-repellent agent. In this embodiment, fluorine-based additive R-30 manufactured by DIC Corporation is used. A main component of the liquid-repellent agent is a perfluoroalkyl material. The liquid-repellent agent is added to a solution of the resist material (hereinafter referred to as the "resist solution") so that the content is about 0.2% by weight.

Figure 6B:
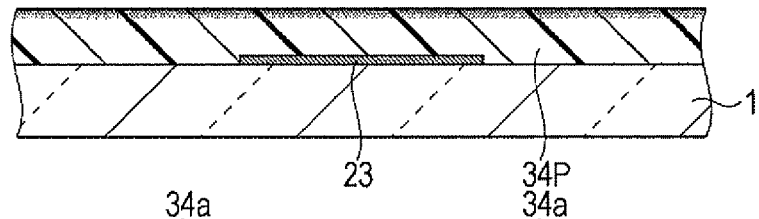

Next, the deposited coating film 34P is heat-treated. The heating temperature is about 100° C. to 120° C. The heat treatment step is not a new step and the post-baking temperature is set in consideration of thermal diffusion of the liquid-repellent agent added. The liquid-repellent agent has the property of thermally diffusing to the surface layer of the coating film 34P by heat treatment as shown in FIG. 6B. Therefore, in a resulting state, the concentration of the liquid-repellent agent is high near the surface of the coating film 34P and is decreased in a bulk. In FIG. 6B, a diffusion state of the liquid-repellent agent in the coating film 34P is shown by gradation. Although the diffusion state of the liquid-repellent agent is actually not observed with the eyes, it can be made clear by surface analysis such as IMA (Ion Microprobe Analysis) or the like.

Figure 6C:
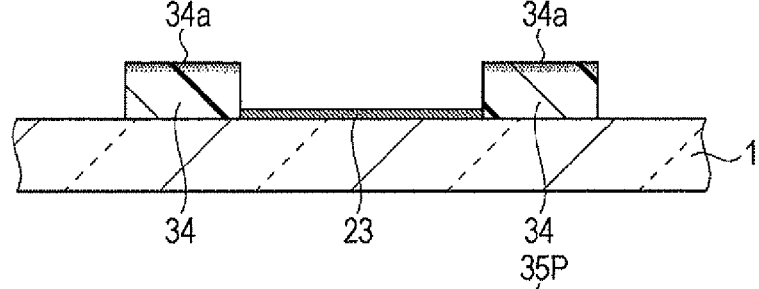

Then, as shown in FIG. 6C, the first partition wall 34 having a desired width is formed by exposure and development of the coating film 34P using photolithography. As a result, the first partition wall 34 having the upper surface 34a imparted with liquid repellency and the side wall 34b having lower liquid repellency than the upper surface 34a can be formed.

Figure 6D:
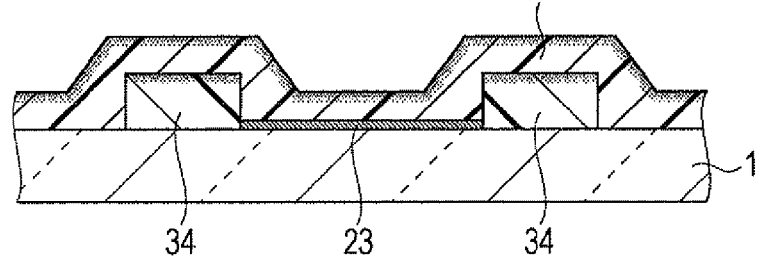

Then, the second partition wall 35 is formed by the same method as that for forming the first partition wall 34. Specifically, as shown in FIG. 6D, a coating film 35P is formed to cover the first partition wall 34 using a resist solution containing a liquid-repellent agent and then heat-treated by the same method as the above. The thickness of $h_2$ of the coating film 35P is about 1 to 2 µm. In this case, the content of the liquid-repellent agent is about 1.0 wt % and is higher than that for forming the first partition wall 34.

Figure 6E:
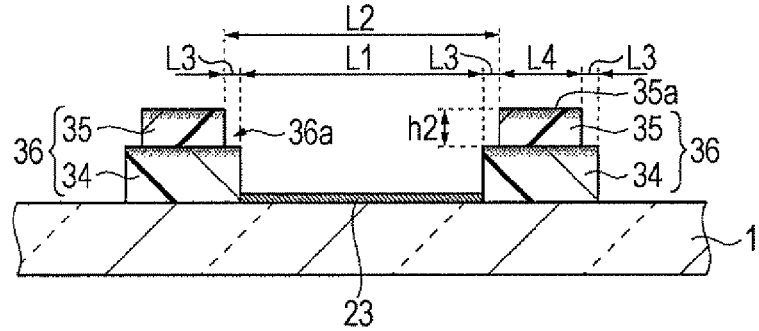

Then, as shown in FIG. 6E, the second partition wall 35 having a smaller width than that of the first partition wall 34 is formed on the first partition wall 34 by exposure and development of the coating film 35P using photolithography.

The distance L2 between the second partition walls 35 is set to be larger than the distance L1 between the first partition walls 34 in a direction parallel to the surface of the element substrate 1 so that the step portion 36a is formed in the side wall of the partition wall 36. The upper surface 34a of the step portion 36a maintains liquid repellency. In addition, the top of the partition wall 36, i.e., the upper surface 35a of the second partition wall 35, has higher liquid repellency than the upper surface 34a of the step portion 36a because of the higher concentration of the liquid-repellent agent.

In addition, the thickness $h_1$ of the first partition wall 34 and the thickness $h_2$ of the second partition wall 35 are determined in consideration of the type and concentration of the liquid applied and the filling amount in the film-forming region A. The width L3 of the step portion 36a is preferably about 1 µm or more in view of the property of pinning the liquid which passes over the step portion 36a. Further, the width L4 of the second partition wall 35 is preferably determined so as to prevent mixing of the applied liquid between the adjacent film-forming regions A. Then, the method advances to Step S2.

Figure 6F:
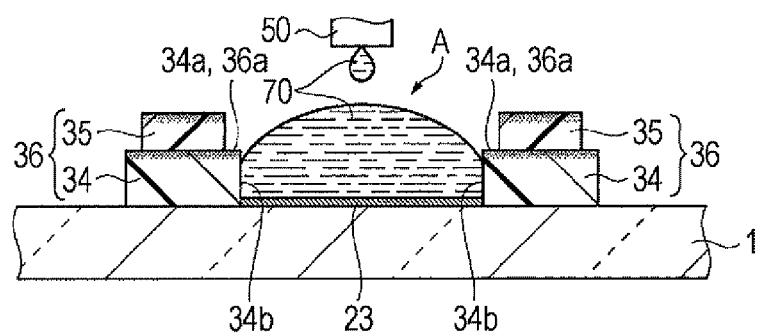

In Step S2 of forming the hole injection layer, as shown in FIG. 6F, a liquid 70 containing a hole injection layer-forming material is applied to the film-forming region A defined by the partition wall 36. In order to securely fill the film-forming region A with a predetermined amount of the liquid 70, in this embodiment, a droplet ejection method (ink jet method) of ejecting as droplets the liquid 70 from nozzles of an ejection head 50 is used. The ejection head 50 is referred to as an "ink jet head" which has a plurality of micro nozzles so that droplets are ejected from the nozzles toward the film-forming region A. The liquid 70 landing on the pixel electrode 23 spreads due to wetting of the film-forming region A and rises due to surface tension as the ejection of droplets proceeds. In addition, the step portion 36a serves as the measure for filling the liquid 70 so that the liquid 70 is filled so as not to pass over the upper surface 34a of the step portion 36a. Since the upper surface 34a of the step portion 36a has liquid repellency, the liquid 70 little passes over the upper surface 34a. Even if the liquid 70 passes over the upper surface 34a, the liquid 70 is repelled and received in the film-forming region A defined by the first partition wall 34. Since the side wall 34b of the first partition wall 34 has lower liquid repellency than the upper surface 34a, the liquid 70 can be uniformly filled.

In order to uniformly spread the liquid 70 in the film-forming region A, plasma treatment may be performed with $O_2$ (oxygen) as treatment gas before the liquid 70 is applied. As a result, lyophilicity can be imparted to the surface of the pixel electrode 23 composed of an inorganic material and the side wall 34b of the first partition wall 34 (the side wall 35b of the second partition wall 35) which has a low concentration of liquid-repellent agent.

Figure 7G:
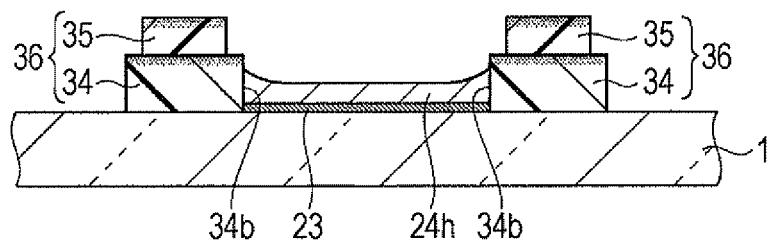
FIGS. 7G to 7K are schematic sectional views showing a method for manufacturing an organic EL element of Example 1.

As shown in FIG. 7G, the element substrate 1 on which a predetermined amount of the liquid 70 is applied to the film-forming region A is dried by lamp annealing or reduced-pressure drying and heat-treated (200° C., about 10 minutes) to form the hole injection layer 24h. Since the liquid 70 is securely pinned by the side wall 34b of the first partition wall 34 during drying, the hole injection layer 24h having a stable sectional shape and a substantially uniform thickness can be formed.

The liquid 70 is a solution containing, for example, diethylene glycol and water (pure water) as a solvent, and 0.5 wt % of a mixture (PEDOT/PSS) as the hole injection layer-forming material containing a polythiophene derivative, such as polyethylene dioxythiophene (PEDOT), and polystyrenesulfonic acid (PSS) as a dopant. The ratio of the solvent is adjusted so that the viscosity is about 20 mPa·s or less.

Using the liquid 70, the hole injection layer 24h having a thickness of about 50 nm heat-drying is formed.

Examples of the hole injection layer-forming material other than PEDOT/PSS include polystyrene, polypyrrole, polyaniline, polyacetylene, and derivatives thereof. The method advances to Step S3.

Figure 7H:
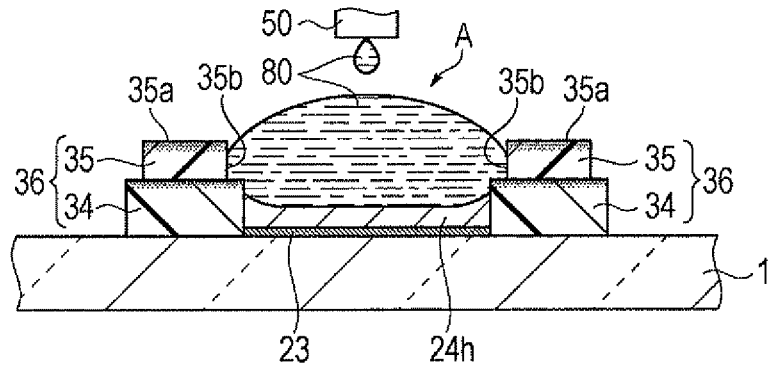

In Step S3 of forming the intermediate layer, as shown in FIG. 7H, a liquid 80 containing an intermediate layer-forming material is ejected as droplets from the ejection head 50 to the film-forming region A defined by the partition wall 36. The liquid 80 is ejected in a predetermined amount which allows uniform filling in the film-forming region A defined by the second partition wall 35 over the step portion 36a. The top 35a which is the uppermost surface of the partition potion 36 has highest liquid repellency as compared with the other portions, and thus the liquid 80 is ejected so as not to pass over the top 35a.

The liquid 80 is a solution containing, for example, cyclohexylbenzene as a solvent, and 0.1 wt % of a polyolefin polymer fluorescent material or a triphenylamine polymer which is the intermediate layer-forming material exhibiting hole transport performance.

Figure 7I:
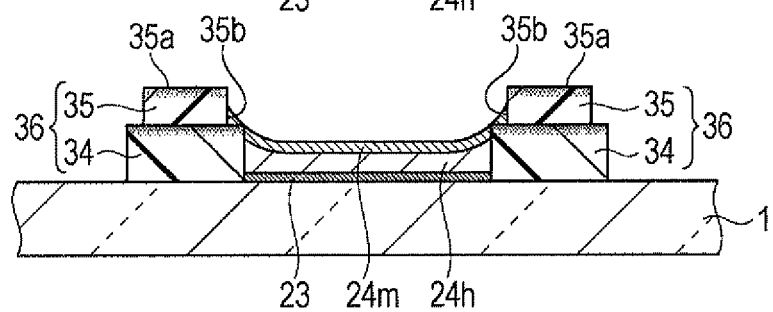

Then, as shown in FIG. 7I, the element substrate 1 on which the liquid 80 is applied is dried under reduced pressure and heat-treated (130° C., about 1 hour) in an inert gas atmosphere of, for example, nitrogen, to form the intermediate layer 24m having a thickness of about 10 nm. Since the upper surface 34a of the step portion 36a is flat, and the side wall 35b of the second partition wall 35 has lyophilicity, the contact interface of the liquid 80 which passes over the step portion 36a with the side wall 35b is little retracted during drying. Therefore, the liquid 80 is securely pinned by the side wall 35b. As a result, the intermediate layer 24m having a stable sectional shape is obtained along the surface of the hole injection layer 24h previously formed. Then, the method advances to Step S4.

Figure 7J:
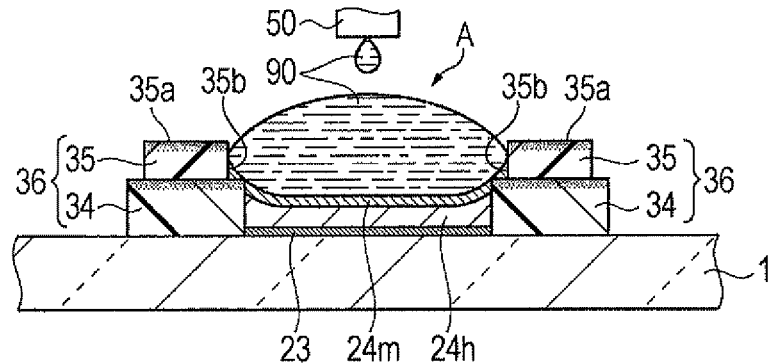

In Step S4 of forming the light-emitting layer, as shown in FIG. 7J, a liquid 90 containing a light-emitting layer-forming material is ejected as droplets from the ejection head 50 to the film-forming region A defined by the partition wall 36. The liquid 90 is ejected in a predetermined amount which allows uniform filling in the film-forming region A defined by the second partition wall 35 over the step portion 36a. Of course, the liquid 90 is also ejected so as not to pass over the top 35a of the partition wall 36.

The liquid 90 contains the light-emitting layer-forming material which emits red, green, or blue fluorescence or phosphorescence in a solvent. As the light-emitting layer-forming material, a polyolefin polymer fluorescent material or a polyfluorene derivative (PF) is preferably used. Examples of the light-emitting layer-forming material other than PF include polythiophenylene derivatives such as polyparaphenylenevinylene derivatives (PPV), polyphenylene derivatives (PP), polyparaphenylene derivatives (PPP), polyvinyl carbazole (PVK), PEDOT, and the like; polymethylphenylene silane (PMPS); and the like. Such a high-molecular material may be doped with a high-molecular materials such as a perylene dye, a coumarin dye, a rhodamine dye, or the like, or a low-molecular material such as rubrene, perylene, 9,10-diphenylanthracene, tetraphenylbutadiene, Nile red, coumarin 6, quinacridone, or the like.

In Example 1, a solution containing cyclohexylbenzene as a solvent, and 0.7 wt % of a polyolefin polymer fluorescent material is used. The viscosity is about 14 mPa·s.

Figure 7K:
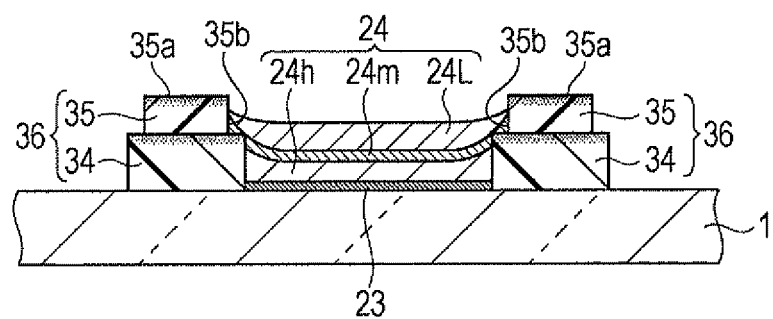

Then, as shown in FIG. 7K, the element substrate 1 on which the liquid 90 is applied is dried under reduced pressure and heat-treated (130° C., about 1 hour) in an inert gas atmosphere of, for example, nitrogen, to form the light-emitting layer 24L having a thickness of about 80 nm. Like the liquid 80, the contact interface of the liquid 90 which passes over the step portion 36a with the side wall 35b of the second partition wall 35 is securely pinned during drying. As a result, the light-emitting layer 24L having a stable sectional shape is obtained along the surface of the intermediate layer 24m previously formed. Of course, the liquid 90 is ejected from the ejection head 50 for each luminescent color toward the corresponding film-forming regions A of the same color. Then, the method advances to Step S5.

In Step S5 of forming the common electrode, as shown in FIG. 4, the common electrode 27 serving as the cathode is formed to cover the light-emitting layer 24L of each color and the partition wall 36. As a result, the organic EL element 20 is completed.

As a material of the common electrode 27, at least two of metals such as Ca, Ba, Mg, Al, and the like and fluorides such as LiF and the like are preferably used in combination. In particular, preferably, a film of Ca, Ba, or LiF which has small work function is formed near the functional layer 24, and a film of Mg or Al with large work function is formed away from the functional layer 24. In addition, a protective layer of $SiO_2$, SiN, or the like may be laminated on the common electrode 27. In this case, oxidation of the common electrode 27 can be prevented.

As a method for forming the common electrode 27, vapor deposition, sputtering, CVD, or the like can be used. In particular, the vapor deposition method is preferred from the viewpoint that thermal damage to the functional layer 24 can be prevented.

In Example 1, Ca of about 5 nm and Al of about 300 nm are vapor-deposited in that order to form the common electrode 27 having reflectivity.

The element substrate 1 on which the driving circuit portions and the organic EL elements 20 are formed and a sealing substrate are bonded together to complete the organic EL device 10.

According to the method for manufacturing the organic EL element 20 of Example 1, the hole injection layer 24h, the intermediate layer 24m, and the light-emitting layer 24L in the functional layer 24 can be formed with stable thicknesses and sectional shapes in high yield. Namely, the organic EL device 10 having the bottom emission-type organic EL elements 20 with reduced luminance variation for each of different luminescent colors can be manufactured in high yield.

Example 2

Figure 8:
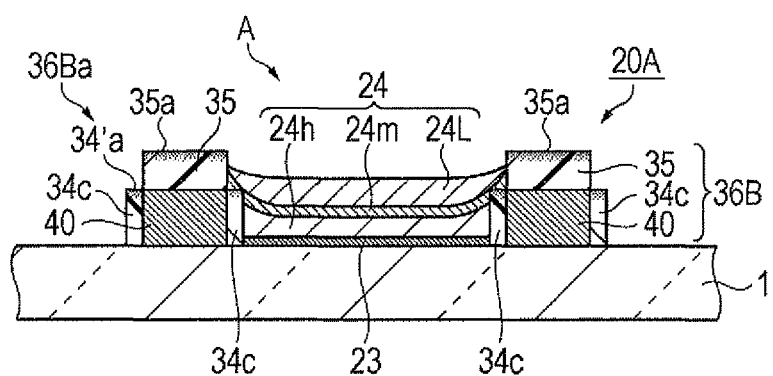
FIG. 8 is a schematic sectional view showing a structure of an organic EL element of Example 2.
Figure 9A:
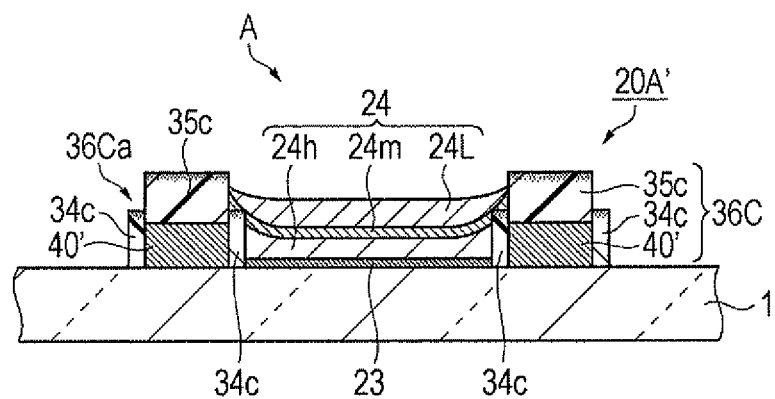
FIGS. 9A and 9B are schematic sectional views each showing a structure of an organic EL element of a modified example of Example 2.
Figure 9B:
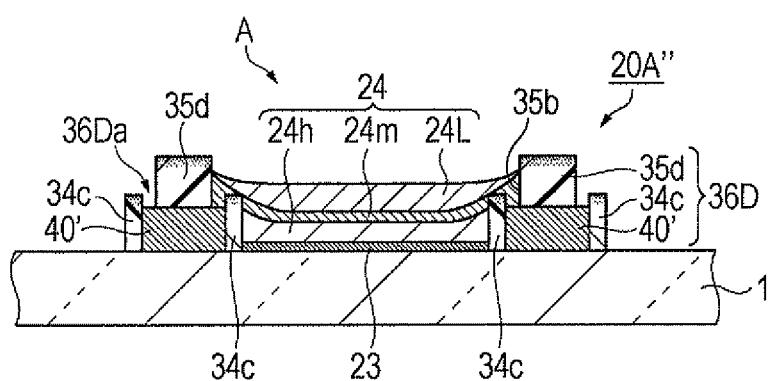

Next, an organic EL element of Example 2 and a method for manufacturing the same are described with reference to FIGS. 8 and 9A and 9B. FIG. 8 is a schematic sectional view showing a structure of an organic EL element of Example 2. FIGS. 9A and 9B are schematic sectional views each showing a structure of an organic EL element of a modified example of Example 2. In addition, the same components as in Example 1 are denoted by the same reference numerals and detail description thereof is omitted. In FIGS. 8 and 9A and 9B, a common electrode 27 is not shown.

An organic EL element of Example 2 utilizes the structure provided around the pixel element 23 in Example 2.

As shown in FIG. 8, an organic EL element 20 of Example 2 includes a pixel electrode 23 provided on an element substrate 1, a partition wall 36B which defines a film-forming region A including the pixel electrode 23 in two dimensions, and a functional layer 24 provided in the film-forming region A.

The partition wall 36B includes a structure 40 provided around the pixel electrode 23, first partition walls 34c provided inside and outside of the structure 40 to hold the structure 40 therebetween, and a second partition wall 35 provided on the structure 40. The expression "inside of the structure 40" represents the side where the functional layer 24 is provided as shown in FIG. 8. In fact, as described at the beginning of the description, in the organic EL device 10, the light-emitting pixels 7 (refer to FIG. 1) which emit different luminescent colors are arranged in stripes, and thus the functional layers 24 which emit different luminescent colors are provided inside and outside of the structure 40 provided between the light-emitting pixels 7 which emit different luminescent colors. In addition, the functional layers 24 which emit the same luminescent color are provided inside and outside of the structure 40 provided between the light-emitting pixels 7 which emit the same luminescent color. In other words, in the planar arrangement of the first partition walls 34c, the first partition walls 34c are formed along the outer edges of the structure and on the side where the functional layer 24 is formed. If the functional layer 24 need not be provided outside of the structure 40, the first partition wall 34c need not be provided outside of the structure 40.

Like in Example 1, the first partition walls 34c and the second partition wall 35 are formed using a photosensitive resin material containing a liquid-repellent agent. A coating film composed of the photosensitive resin material is formed on the element substrate 1 so as to cover the pixel electrode 23 and the structure 40. The coating film is formed to a thickness substantially the same as the height of the structure 40. Then, the coating film is heat-treated and then subjected to exposure and development to form the first partition walls 34c which partition the pixel electrode 23 and which have a height substantially the same as that of the structure 40. The development is performed so that the upper surface of the structure 40 is exposed.

Next, again a coating film is formed using a photosensitive resin material containing a liquid-repellent agent so as to cover the pixel electrode 23, the first partition walls 34c, and the structure 40 and then heat-treated. The heat-treated coating film is subjected to exposure and development to form, on the structure 40, the second partition wall 35 having a width substantially the same as the structure 40. Consequently, a step portion 36Ba is formed in the side wall using the first partition walls 34c formed on both sides of the structure 40 and the second partition wall 35 formed on the structure 40.

Like in Example 1, the content of the liquid-repellent agent in the photosensitive resin material is about 0.2 wt % for the first partition walls 34c and about 1.0 wt % for the second partition wall 35. In addition, the width of the first partition walls 34c provided along the outer edges of the structure 40 is preferably 1 µm or more.

Therefore, the step portion 36Ba having the substantially flat upper surface 34a' with lower liquid repellency than that of the top 35a can be formed.

Therefore, like in Example 1, the hole injection layer 24h, the intermediate layer 24m, and the light-emitting layer 24L having stable sectional shapes can be formed on the pixel electrode 23 by applying in turn different liquids 70, 80, and 90 containing respective functional layer-forming materials to the film-forming region A, drying the coating films, and heat-treating the coating films.

As the structure 40 provided around the pixel electrode 23, as shown in FIG. 2, main wiring such as the scanning lines 31, the data lines 41, and the power supply lines 42, or elements such as TFT 11 and 12 and the storage capacitors 13 can be used. In particular, the wiring is composed of a low-resistance metallic materials such as Al and is provided to a thickness of several hundreds nm to several thousands nm (several µm) in order to secure wiring resistance. When the power supply lines 42 are actually provided in parallel to the scanning lines 31 as shown in FIG. 2, the power supply lines 42 may be laminated to overlap the scanning lines 31 through an insulating layer. Therefore, the structure 40 may be a single-layer structure or a laminate of plural layers.

By using the structure as a portion of the partition wall 36B as described above, an organic EL element 20A can be formed by effectively using the space on the element substrate 1 as compared with the case in which as in Example 1, the partition wall 36 is provided separately from the structure 40.

In addition, in Example 1, when a coating film 35P as a precursor of the second partition wall 35 is formed on the upper surfaces 34a of the first partition walls 34c, a resist solution may be repelled due to liquid repellency of the upper surfaces 34a, thereby causing nonuniformity in coating. On the other hand, in Example 2, a coating film is formed on the structure 40 composed of a low-resistance metallic material, an insulating layer, or an inorganic material such as a semiconductor layer, and thus the second partition wall 35 with a stable shape can be formed without causing nonuniformity in coating on the formation surface.

Conceivable modified examples of Example 2 which utilizes a structure as a portion of a partition wall include a case in which the height of the first partition walls 34c is not necessarily the same as the height of the structure 40' as shown in FIG. 9B. An organic EL element 20A' of the modified example includes a pixel electrode 23 provided on an element substrate 1, a partition wall 36C which defines a film-forming region A including the pixel electrode 23 in two dimensions, and a function layer 24 provided in the film-forming region A.

The partition wall 36C includes a structure 40' provided around the pixel electrode 23, first partition walls 34c provided inside and outside of the structure 40' to hold the structure 40' therebetween and to have a height larger than that of the structure 40', and a second partition wall 35c provided on the structure 40'. A step portion 36Ca is formed using the first partition walls 34c and the second partition wall 35c.

Namely, when the height of the structure 40' does not coincide with a desired height of the first partition walls 34c, the height of the second partition wall 35c provided on the structure 40' may be adjusted for securing the height of the partition walls 36c.

Also, as described above, when the structure includes the wiring constituting the driving circuit portions, the height of the structure may be different in the extension direction of the scanning lines 31 and the power supply lines 42 and the extension direction of the data lines 41. Therefore, the configurations shown in FIGS. 8 and 9A may be mixed depending on the direction in which the partition wall including the structure is provided.

Further, as shown in FIG. 9B, the width of a second partition wall 35d provided on the structure 40' may not necessarily be different from the width of the structure 40'. For example, an organic EL element 20A" of a modified example includes a pixel electrode 23 provided on an element substrate 1, a partition wall 36D which defines a film-forming region A including the pixel electrode 23 in two dimensions, and a function layer 24 provided in the film-forming region A.

The partition wall 36D includes a structure 40' provided around the pixel electrode 23, first partition walls 34c provided inside and outside of the structure 40' to hold the structure 40' therebetween and to have a height larger than that of the structure 40', and a second partition wall 35d provided on the structure 40'.

The width of the second partition wall 35d is smaller than that of the structure 40'. Therefore, a groove-like step portion 36Da is formed in the side wall of the partition wall 36D using the first partition walls 34c, the structure 40', and the second partition wall 35d. When the film-forming region A defined by the partition wall 36D is filled with a liquid 80 or 90 over the step portion 36Da, the liquid 80 or 90 is received by the groove-like step portion 36Da and is securely pinned by the side wall 35b of the second partition wall 35d, thereby forming the intermediate layer 24m or the light-emitting layer 24L As described above, at least two may be selected from the partition walls 36B, 36C, and 36D shown in FIG. 8 and FIGS. 9A and 9B and combined according to the direction in which the partition wall including the structure is formed.

Each of Examples 3 to 7 described below is an example in which the configuration of the partition wall and the method for imparting liquid repellency to the partition wall in Example 1 or 2 are changed. The same components as in Example 1 are denoted by the same reference numerals, and a description thereof is omitted.

Example 3

Figure 10:
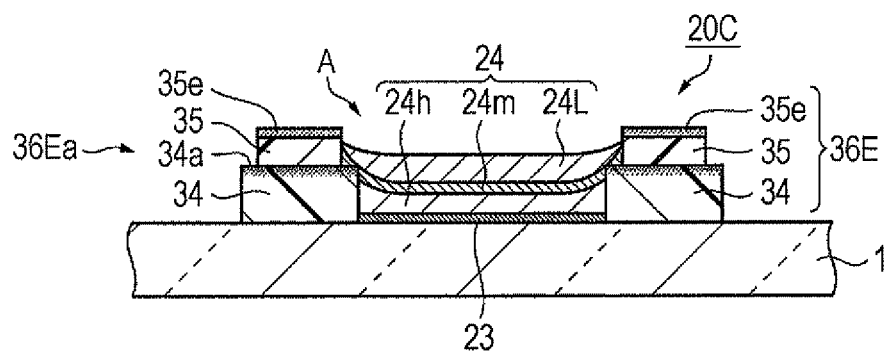
FIG. 10 is a schematic sectional view showing a structure of an organic EL element of Example 3.
Figure 11A:
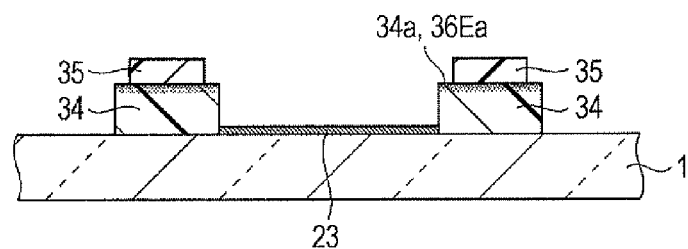
FIGS. 11A to 11C are drawings illustrating a method for forming a partition wall in an organic EL element of Example 3.
Figure 11B:
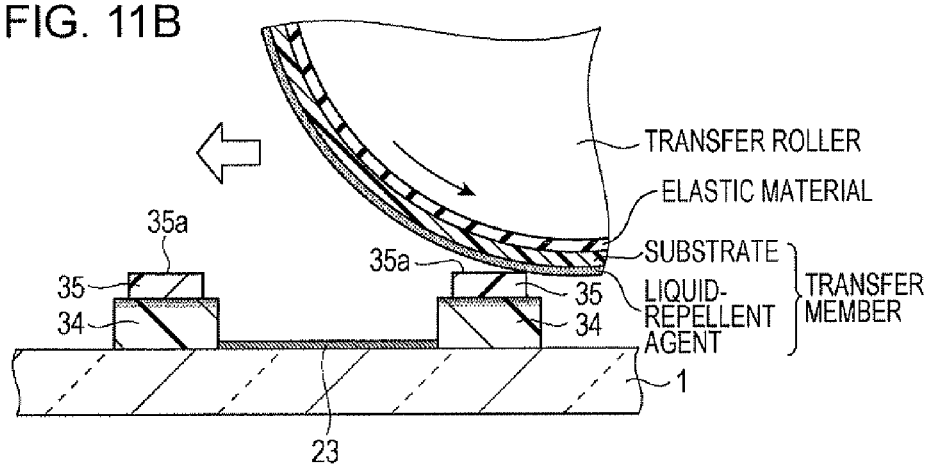
Figure 11C:
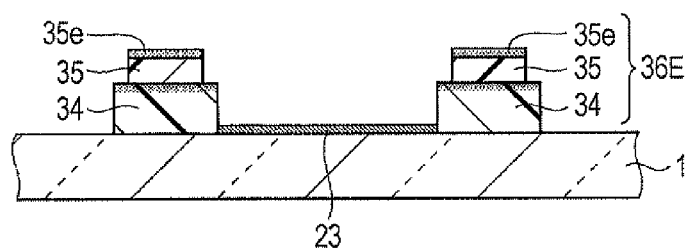

FIG. 10 is a schematic sectional view showing a structure of an organic EL element of Example 3. FIGS. 11A to 11C are drawings illustrating a method for forming a partition wall in an organic EL element of Example 3. In FIG. 10, a common electrode 27 is not shown.

As shown in FIG. 10, an organic EL element 20C of Example 3 includes a pixel electrode 23 provided on an element substrate 1, a partition wall 36E which defines a film-forming region A including the pixel electrode 23 in two dimensions, and a function layer 24 provided in the film-forming region A.

The partition wall 36E includes a first partition wall 34 which defines the pixel electrode 23, a second partition wall 35 provided on the first partition wall 34 to have a width smaller than that of the first partition wall 34, and a liquid-repellent layer 35e provided on the second partition wall 35. A step portion 36Ea is formed in the side wall of the partition wall 36E using the first partition wall 34 and the second partition wall 35. In addition, liquid repellency is imparted to the upper surface 34a of the step portion 36Ea.

Like in Example 1, the functional layer 24 includes the hole injection layer 24h, the intermediate layer 24m, and the light-emitting layer 24L which are formed by applying in turn liquids 70, 80, and 90 containing respective functional layer-forming materials to the film-forming region A defined by the partition wall 36E, drying the coating films, and heat-treating the coating films. The hole injection layer 24h, the intermediate layer 24m, and the light-emitting layer 24L are pinned at stable positions on the side wall of the partition wall 36E and each have a stable sectional shape.

In Example 3, like in Example 1, as shown in FIG. 11A, the method for forming the partition wall 36E includes forming a coating film using a photosensitive resin material (resist material) containing a liquid-repellent agent, heat-treating the coating film, and performing exposure and development of the heat-treated coating film to form the first partition wall 34 having the upper surface 34a to which liquid repellency is imparted. Then, a coating film is formed using a photosensitive resin material not containing a liquid-repellent agent to cover the surface of the element substrate 1 on which the first partition wall 34 is formed and subjected to exposure and development to form the narrower second partition wall 35 on the first partition wall 34.

Next, as shown in FIG. 11B, a transfer member including a substrate on which a layer of a liquid-repellent agent is formed by coating is pressed by a transfer roller including an elastic material, such as rubber, provided on the peripheral surface thereof so that the layer of the liquid-repellent agent is pressed onto the upper surface 35a of the second partition wall 35. As a result, as shown in FIG. 11C, the layer of the liquid-repellent agent formed on the substrate is transferred to the upper surface 35a of the second partition wall 35 to form the liquid-repellent layer 35e.

Therefore, the method for imparting liquid repellency to the upper surface 34a of the first partition wall 34 is different from the method for imparting liquid repellency to the upper surface 35a of the second partition wall 35.

In Example 3, a polyethylene terephthalate film (PET film) having a thickness of about 20 μm is used as the substrate. A liquid-repellent agent containing a fluorine compound is applied to a thickness of about 80 nm on the PET film using a bar coater and then dried by heating at about 100° C. to form a film. As the liquid-repellent agent, Novec (trade name) EGC-1720 manufactured by Sumitomo 3M Limited is used. As the liquid-repellent agent, a liquid-repellent agent containing a silicone compound may be used.

The configuration of the partition wall 36E and the method for forming the partition wall 36E can decrease the number of heat treatments of the element substrate 1 and contribute to energy saving as compared with the case in which liquid repellency is imparted to the upper surface 35a of the second partition wall 35 by thermal diffusion. In addition, the degree of liquid repellency of the top (upper surface) 35a of the partition wall 36E can be easily made different from that of the upper surface 34a of the step portion 36Ea. High liquid repellency can be easily realized by the liquid-repellent layer 35e formed by the transfer method as compared with liquid repellency imparted by thermal diffusion. Further, the liquid-repellent layer 35e can be selectively formed, and thus lyophilicity of the second partition wall 35 can be secured.

In Example 3, the liquid-repellent layer 35e is formed on the upper surface of the second partition wall 35 by the transfer method. However, like the second partition wall 35, a liquid-repellent layer may be formed on the upper surface of the first partition wall 34 not containing a liquid-repellent agent by the transfer method. In this case, the number of heat treatments can be further decreased.

Example 4

Figure 12:
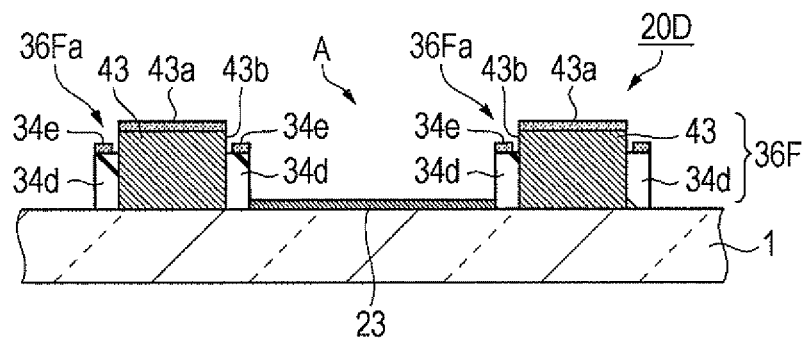
FIG. 12 is a schematic sectional view showing a structure of an organic EL element of Example 4.

FIG. 12 is a schematic sectional view showing a structure of an organic EL element of Example 4. Since a configuration of a partition wall is important, a common electrode 27 and a functional layer 24 which are the same as in the other examples are not shown in FIG. 12.

As shown in FIG. 12, an organic EL element 20D of Example 4 includes a partition wall 36F which defines a pixel electrode 23 provided on an element substrate 1.

The partition wall 36F includes a structure 43 provided around the pixel electrode 23 on the element substrate 1, and first partition walls 34d provided inside and outside of the structure 43 to hold the structure 43 therebetween and have a lower height than that of the structure 43. Further, a liquid-repellent layer 43a is provided on the upper surface of the structure 43, and liquid-repellent layers 34e are provided on the upper surfaces of the first partition walls 34d.

A step portion 36Fa is formed in the side wall of the partition wall 36F using the structure 43 and the first partition walls 34d.

The liquid-repellent layers 43a and 34e are formed by the transfer method described in Example 3. Since a difference in height between the structure 43 and the first partition walls 34d, i.e., a difference in level of the step portion 36Fa, is of the μm order, the liquid-repellent layers 43a and 34e can be formed by one time of transfer.

When the liquid-repellent layers 34e are formed on the upper surfaces of the first partition walls 34d by the transfer method, the liquid-repellent layers 34e are little transferred to the sides near the side wall 43b of the structure 43. In other words, a low-liquid-repellency portion without the liquid-repellent layer 34e is formed in the step portion 36Fa near the side wall 43b.

A portion above the step portion 36Fa exhibits lyophilicity for the liquids 80 and 90 because the side wall 43b of the structure 43 is mainly composed of an inorganic material.

Therefore, when the film-forming region A defined by the partition wall 36F is filled with the liquids 70, 80, and 90, the step portion 36Fa serves as a measure so that different organic films (the hole injection layer 24h, the intermediate layer 24m, and the light-emitting layer 24L) having stable sectional shapes are formed on the lower and upper sides of the step portion 36Fa to hold the step portion 36Fa therebetween.

According to Example 4, the partition wall 36F having a simplified configuration formed by a simplified method can be provided because the second partition wall 35 in Example 2 need not be formed.

Example 5

Figure 13:
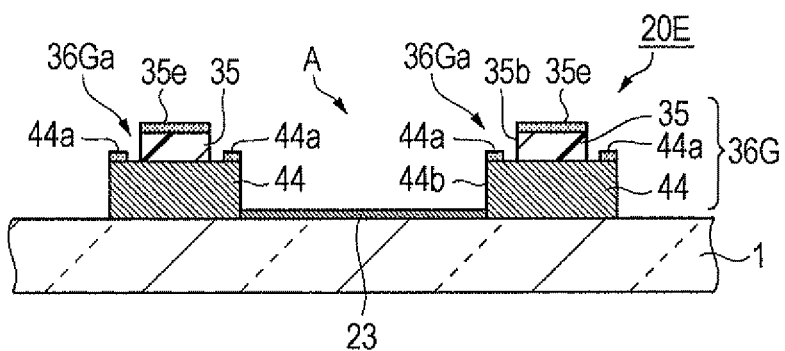
FIG. 13 is a schematic sectional view showing a structure of an organic EL element of Example 5.

FIG. 13 is a schematic sectional view showing a structure of an organic EL element of Example 5. Since a configuration of a partition wall is important, a common electrode 27 and a functional layer 24 which are the same as in the other examples are not shown in FIG. 13.

As shown in FIG. 13, an organic EL element 20E of Example 5 includes a partition wall 36G which defines a pixel electrode 23 provided on an element substrate 1.

The partition wall 36G includes a structure 44 provided around the pixel electrode 23 on the element substrate 1, and a second partition walls 35 provided on the structure 44 and having a width smaller than that of the structure 44. A step portion 36Ga is formed in the side wall of the partition wall 36G using the structure 44 and the second partition wall 35.

Further, a liquid-repellent layer 44a is provided on the upper surface of the step portion 36Ga, and liquid-repellent layer 35e is provided on the upper surface of the second partition wall 35. The liquid-repellent layers 44a and 35e are formed by the transfer method described in Example 3. Since the height of the second partition wall 35 on the structure 44, i.e., a difference in level of the step portion 36Ga, is of the μm order, the liquid-repellent layers 44a and 35e can be formed by one time of transfer.

As described above, the structure 44 is mainly composed of an inorganic material, and thus the side wall 44b thereof exhibits lyophilicity.

When the liquid-repellent layer 44a is formed on the upper surface of the structure 44 by the transfer method, the liquid-repellent layer 44a is little transferred to the side near the side wall 35b of the second partition wall 35. In other words, a lyophilic portion without the liquid-repellent layer 44a is exposed in the step portion 36Ga near the side wall 35b.

Therefore, when the film-forming region A defined by the partition wall 36G is filled with the liquids 70, 80, and 90, the step portion 36Ga serves as a measure so that different organic films (the hole injection layer 24h, the intermediate layer 24m, and the light-emitting layer 24L) having stable sectional shapes are formed on the lower and upper sides of the step portion 36Ga to hold the step portion 36Ga therebetween.

According to Example 5, the partition wall 36G having a simplified configuration formed by a simplified method can be provided because the first partition walls 34c in Example 2 need not be formed.

Example 6

Figure 14:
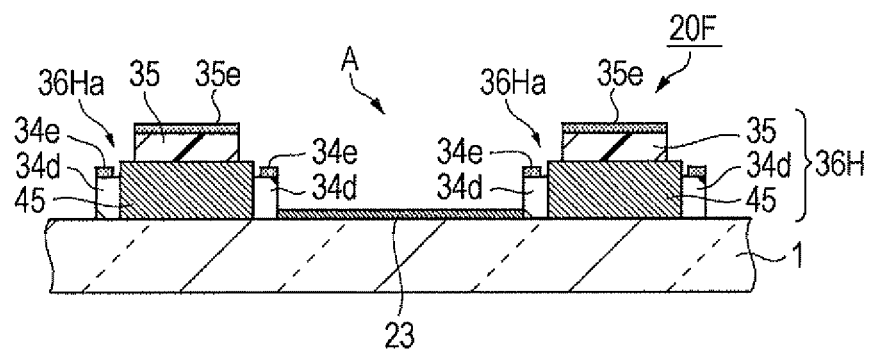
FIG. 14 is a schematic sectional view showing a structure of an organic EL element of Example 6.

FIG. 14 is a schematic sectional view showing a structure of an organic EL element of Example 6. Since a configuration of a partition wall is important, a common electrode 27 and a functional layer 24 which are the same as in the other examples are not shown in FIG. 14.

As shown in FIG. 14, an organic EL element 20F of Example 6 includes a partition wall 36H which defines a pixel electrode 23 provided on an element substrate 1.

The partition wall 36H includes a structure 45 provided around the pixel electrode 23 on the element substrate 1, first partition walls 34d provided inside and outside of the structure 45 to hold the structure 45 therebetween and have a lower height than that of the structure 45, and a second partition walls 35 provided on the structure 45 and having a width slightly smaller than that of the structure 45. Further, liquid-repellent layers 34e are provided on the upper surfaces of the first partition walls 34d, and a liquid-repellent layer 35e is provided on the upper surface of the second partition wall 35.

A step portion 36Ha is formed in the side wall of the partition wall 36H using the first partition walls 34d, the structure 45, and the second partition wall 35.

The liquid-repellent layers 34e and 35e are formed by the transfer method described in Example 3. Since a difference in height between the upper surfaces of the first partition walls 34d and the second partition wall 35, i.e., a difference in level of the step portion 36Ha, is of the µm order, the liquid-repellent layers 34e and 35e can be formed by one time of transfer.

When the liquid-repellent layers 34e are formed on the upper surfaces of the first partition walls 34d by the transfer method, the liquid-repellent layer 34e is little transferred to the upper surfaces on the side near the side wall of the structure 45. In other words, a low-liquid-repellency portion without the liquid-repellent layer 34e is formed on the step portion 36Ha near the structure 45.

A portion of the structure 45 above the step portion 36Ha exhibits lyophilicity for the liquids 80 and 90 because the structure 45 is mainly composed of an inorganic material.

Therefore, when the film-forming region A defined by the partition wall 36H is filled with the liquids 70, 80, and 90, the step portion 36Ha serves as a measure so that different organic films (the hole injection layer 24h, the intermediate layer 24m, and the light-emitting layer 24L) having stable sectional shapes are formed on the lower and upper sides of the step portion 36Ha to hold the step portion 36Ha therebetween.

According to Example 6, two steps having lyophilicity can be formed in the step portion 36Ha.

Example 7

Figure 15A:
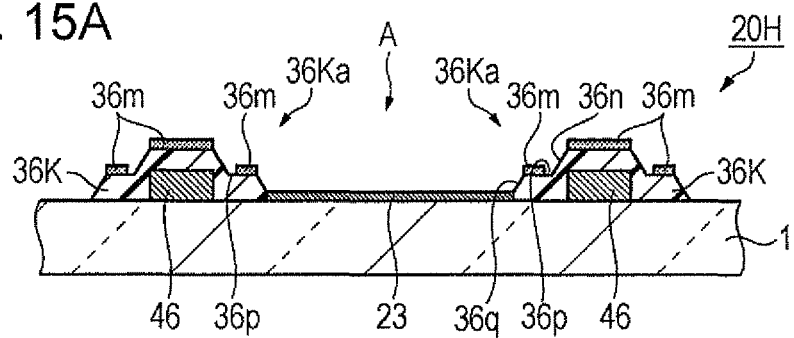
FIG. 15A is a schematic sectional view showing a structure of an organic EL element of Example 7.
Figure 15B:
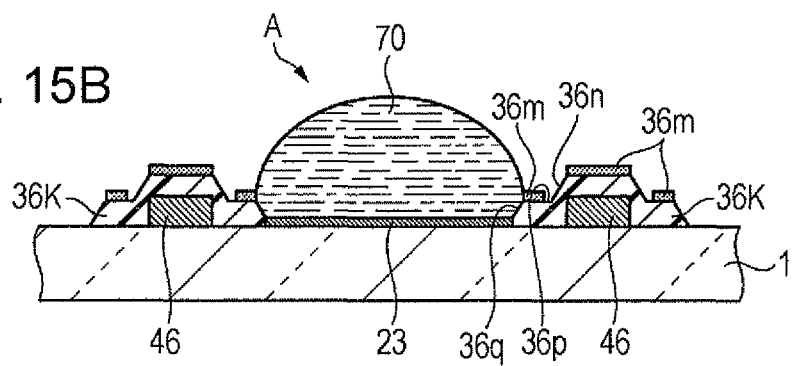
FIGS. 15B and 15C are schematic sectional views illustrating a method for manufacturing an organic EL element of Example 7.
Figure 15C:
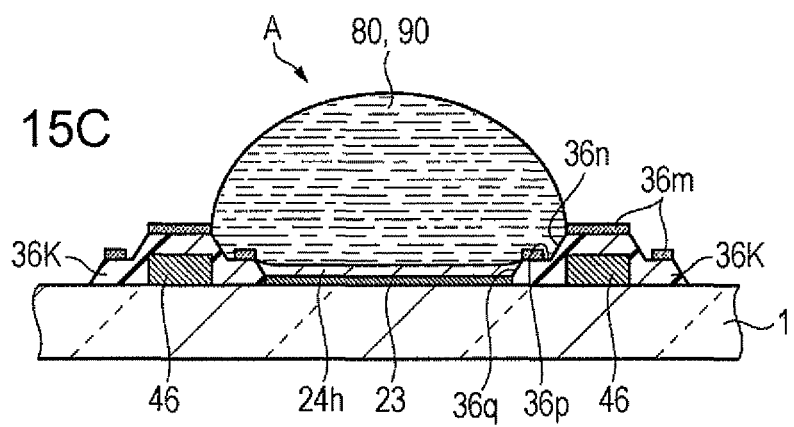

FIG. 15A is a schematic sectional view showing a structure of an organic EL element of Example 7. FIGS. 15B and 15C are schematic sectional views illustrating a method for manufacturing an organic EL element of Example 7. A common electrode 27 and a functional layer 24 which are the same as in the other examples are not shown in FIG. 15A.

As shown in FIG. 15A, an organic EL element 20H of Example 7 includes a partition wall 36K which defines a pixel electrode 23 provided on an element substrate 1.

The partition wall 36K includes a structure 46 provided around the pixel electrode 23 on the element substrate 1 in three dimensions. The width of the top of the partition wall 36K is substantially the same as the width of the structure 46. A step portion 36Ka having a flat upper surface 36p substantially parallel to the surface of the element substrate 1 is provided in a side wall extending from the top and the element substrate 1. The side wall includes inclined side walls 36n and 36q provided on the upper and lower sides of the step portion 36Ka to hold the step portion 36Ka therebetween. Further, liquid-repellent layers 36m are provided on the top and the upper surface of the step portion 36Ka.

As a method for forming the partition wall 36K, a coating film is formed using a photosensitive resin material to cover the surface of the element substrate 1 on which the pixel electrode 23 and the structure 46 are formed. The coating film is subjected to exposure and development to form the partition wall 36K including the structure 46. As a method for forming the step portion 36Ka and the inclined side walls 36n and 36q in the side wall of the partition wall 36K, a method of changing an amount of exposure according to the portions. For example, when a coating film is formed using a positive photosensitive resin material, a portion where the coating film is to be completely left is shielded with a photomask. In s portion where the initial thickness of the coating film is to be decreased to leave the coating film by development, a photomask is formed so that light transmittance is decreased.

The liquid-repellent layers 36m are formed, by the transfer method described in Example 3, on the top of the partition wall 36K and the upper surface of the step portion 36Ka formed as described above.

Further, lyophilicity can be imparted to the side walls 36n and 36q by surface treatment, such as plasma treatment with oxygen used as a treatment gas, of the element substrate 1 on which the partition wall 36K is formed.

Then, as shown in FIG. 153, a liquid 70 is applied to the film-forming region A defined by the partition wall 36K. The liquid 70 is filled to uniformly diffuse over the film-forming region A defined by the side wall 36q without passing over the step portion 36Ka. Since the liquid-repellent layer 36m is formed on the upper surface of the step portion 36Ka, the liquid 70 little passes over the step portion 36Ka. The applied liquid 70 is dried and heat-treated to form the hole injection layer 24h having a stable sectional shape and pinned by the side wall 36q as shown in FIG. 15C.

Next, as shown in FIG. 15C, a liquid 80 is applied to the film-forming region A defined by the partition wall 36K. The liquid 80 is filled to uniformly diffuse over the film-forming region A defined by the side wall 36q while passing over the step portion 36Ka. Since the liquid-repellent layer 36m is formed on the top of the partition wall 36K, the liquid 80 little passes over the top. The applied liquid 80 is dried and heat-treated to form the intermediate layer 24m having a stable sectional shape and pinned by the side wall 36n.

When a liquid 90 is applied to the film-forming region A to form the light-emitting layer 24L, the light-emitting layer 24L having a stable sectional shape and pinned by the side wall 36n can be formed by applying the liquid 90 in the same manner as for the liquid 80.

According to Example 7, the partition wall 36K can be formed one time of photolithography (exposure and development) without being separated into the first partition wall 34 and the second partition wall 35, thereby improving productivity.

According to any one of Examples 1 to 7, each of different organic thin films can be formed at a stable pinning position using as a measure a step portion provided in the side wall of a partition wall which defines a film-forming region A, thereby forming a functional layer 24 having a stable sectional shape.

Among Examples 1 to 7, for example, at least two of Examples 4 to 7 using the common method for imparting liquid repellency to the partition wall may be used in combination.

Figure 16:
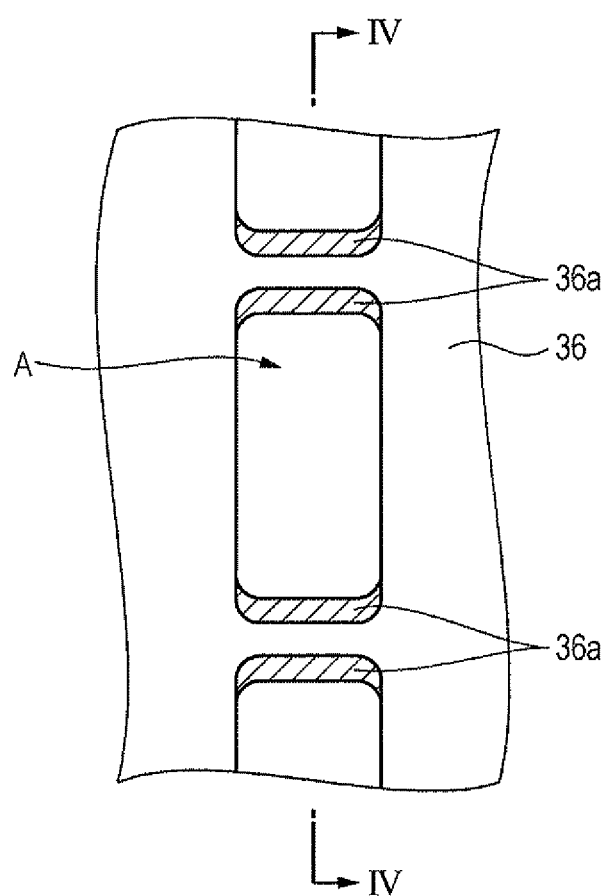
FIG. 16 is a schematic plan view illustrating arrangement of partition walls.
Figure 17A:
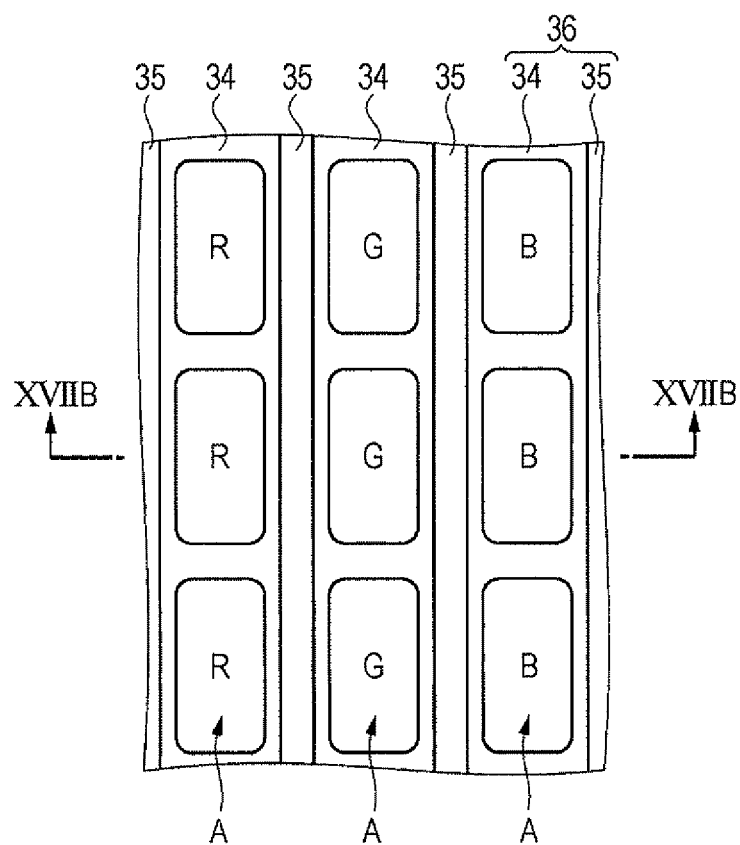
FIGS. 17A and 17B are a schematic plan view and a sectional view, respectively, illustrating another arrangement of partition walls.
Figure 17B:
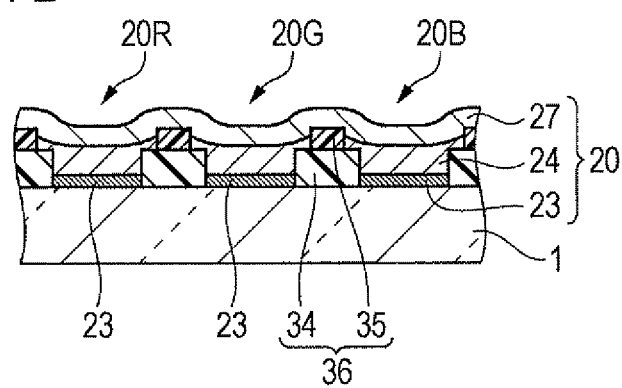

According to any one of Examples 1 to 7, a film-forming region A including a pixel electrode 23 in two dimensions is defined by a partition wall having a step portion. However, the partition wall is not limited to this. FIGS. 16 and 17A and FIG. 17B are schematic plan views and a sectional view, respectively, illustrating arrangements of partition walls.

As shown in FIG. 16, when a film-forming region A where a functional layer 24 is provided has a substantially rectangular shape, for example, the step portion 36a of the partition wall 36 of Example 1 may be provided along the short side (transverse direction) of the film-forming region A. That is, a sectional view of the film-forming region A taken along line IV-IV along the long side (longitudinal direction) corresponds to FIG. 4. This structure shows no step portion 36a in a sectional view of the film-forming region A taken along the short side (transverse direction).

When a film-forming region A has a substantially rectangular planar shape, a liquid filled in the film-forming region A first overflows from the long sides. In addition, it is difficult to spread the liquid to the short sides, thereby easily causing nonuniform coating. Therefore, it is difficult to securely fill the liquid long the short sides, and thus the step portion 36a is provided the partition wall 36 along the short side to serve as a measure for filling, resulting in stabilized pinning positions and formation of organic thin films with stable sectional shapes.

If the film-forming region A has, for example, a circular planar shape which is difficult to define the transverse and longitudinal directions, the partition wall 36 having the step portion 36a is preferably formed along the circumference.

Although, in Example 1, the film-forming region A is defined by the partition wall 36, the film-forming region is not limited to this. For example, as shown in FIGS. 17A and 17B, a region where each organic EL element 20 is provided may be defined by a first partition wall 34, and a second partition wall 35 may be provided on the first partition wall 34 so as to include a plurality of organic EL elements 20 which emit the same luminescent color.

The hole injection layer 24h common to organic EL elements 20R, 20G, and 20B which emit different luminescent colors is formed by applying a liquid 70 to a region defined by the first partition wall 34. The intermediate layer 24m and the light-emitting layer 24L laminated on the hole injection layer 24h are formed by applying liquids 80 and 90 to a region defined by the second partition wall 35. In this case, a region to which the liquids 80 and 90 are applied is extended, and thus a functional layer 24 including the intermediate layer 24m and the light-emitting layer 24L having more stable sectional shapes can be formed over the organic EL elements of the same color.

Second Embodiment

Electronic Apparatus

Figure 18A:
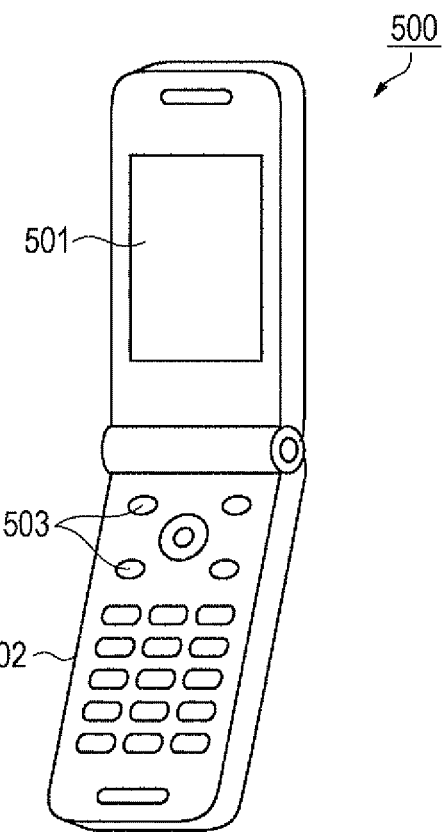
FIG. 18A is a drawing showing a cellular phone as an example of an electronic apparatus.
Figure 18B:
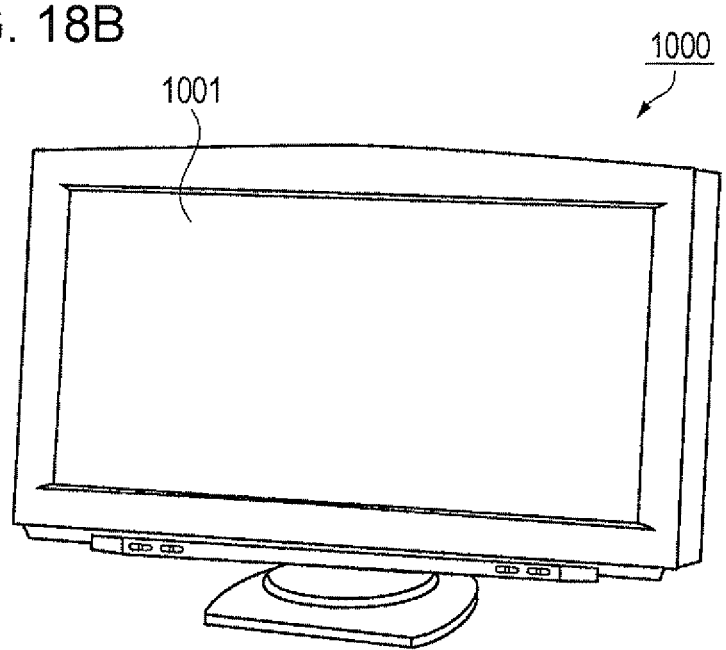
FIG. 18B is a drawing showing a flat-screen television as an example of an electronic apparatus.

Next, an electronic apparatus according to this embodiment is described with reference to FIGS. 18A and 18B. FIG. 18A is a drawing showing a cellular phone as an example of an electronic apparatus. FIG. 18B is a drawing showing a flat-screen television as an example of an electronic apparatus.

As shown in FIG. 18A, a cellular phone 500 as an electronic apparatus according to the embodiment includes a body 502 provided with operation buttons 503, and a display portion 501 provided on the body 502 through a hinge in a fold manner.

The display portion 501 is provided with the organic EL device 10 of the first embodiment.

Since an organic EL element 20 including different organic thin films which are formed with stable sectional shapes in a functional layer 24 is provided, a good-looking cellular phone 500 having long emission life can be provided.

As shown in FIG. 18E, a flat-screen television 1000 as another electronic apparatus of the embodiment includes the organic EL device 10 of Example 1 provided on a display portion 100.

Therefore, a flat-screen television 1000 having excellent durability life and being capable of beautiful full-color display can be provided.

An electronic apparatus provided with the organic EL device 10 is not limited to the cellular phone 500 and the flat-screen television 1000. Examples of such an electronic apparatus includes electronic apparatuses including display portions, such as a personal computer, a handheld information terminal, a navigator, a viewer, and the like.

There are various possible modified examples other than the above-described embodiments. Hereinafter, modified examples are described.

Modified Example 1

In the first embodiment, the organic EL element 20 is provided between the pixel electrode 23 serving as the anode and the common electrode 27 serving as the cathode and has the functional layer 24 including a laminate of different organic thin films including the light-emitting layer 24L. However, the organic EL element 20 is not limited to this. For example, a hole block layer and an electron transport layer may be laminated by vapor deposition between the common electrode 27 serving as the anode and the light-emitting layer 24L. The hole block layer may be composed of BAlq or BCP, and the electron transport layer may be composed of Alq3. The hole block layer has the function to suppress hole leakage from the light-emitting layer 24L. The electron transport layer has the function to improve electron transport performance (injection performance) to the light-emitting layer 24L. In other words, when a layer disposed between the anode and the cathode is regarded as a functional layer, the functional layer is not limited to one including different organic thin films, and may be a laminate of an organic thin film and an inorganic thin film.

Modified Example 2

In the first embodiment, the organic EL element 20 is not limited to the bottom emission type. For example, the pixel electrode 23 and the common electrode 27 may be made of transparent ITO or the like. Preferably, a reflecting layer may be provided below the pixel electrode 23 in the element substrate 1. This is a top emission type in which light emitted from the functional layer 24 is reflected by the reflecting layer and emitted from the common electrode 27 side.

Modified Example 3

For example, in Example 1 of the first embodiment, the step portion 36a provided in the side wall of the partition wall 36 is not limited to one step. A plurality of step portions 36a may be provided according to the configuration of different organic thin films in the functional layer 24.

Modified Example 4

In Example 3 of the first embodiment, the liquid-repellent layer 35e is formed by the transfer method on the upper surface of the second partition wall 35 formed on the first partition wall 34. However, the method for forming a laminate of the second partition wall 35 and the liquid-repellent layer 35e is not limited to this. For example, a transfer member including a liquid-repellent layer and a photosensitive resin layer formed in order on a substrate as shown in FIG. 11B may be used. The transfer member may be transferred to cover the first partition wall 34 and then subjected to exposure and development to form a laminate of the second partition wall 35 and the liquid-repellent layer 35e. This method can be used as a method for forming the first partition wall 34 having the upper surface 34e to which liquid repellency is imparted.

The entire disclosure of Japanese Patent Application No. 2009-257715, filed Nov. 11, 2009 is expressly incorporated by reference herein.

What is claimed is:

1. An organic EL element comprising:
   a functional layer disposed between an anode and a cathode on a substrate and including laminated different organic thin films including a light-emitting layer; and
   a partition wall which defines the functional layer, wherein each of the organic thin films is formed by applying a liquid containing a functional layer-forming material on a film-forming region defined by the partition wall and then drying the liquid;
   the partition wall includes a first partition wall and a second partition wall disposed on the first partition wall, the second partition wall being narrower than the first partition wall, the first and second partition walls defining at least one step portion provided in a side wall of the partition in the thickness direction;
   liquid repellency is imparted to the upper surface of the first partition wall and the upper surface of the second partition wall; and
   the surface of the side wall of the partition excluding the step portion has lyophilicity in comparison with the upper surface of the step portion.

2. The organic EL element according to claim 1, wherein the upper surface of the step portion has lower liquid repellency than that of the uppermost surface of the partition wall.

3. An organic EL device comprising:
   the organic EL element according to claim 1.

4. An electronic apparatus comprising the organic EL device according to claim 3.

5. An organic EL device comprising:
   a functional layer disposed between an anode and a cathode on a substrate that includes laminated different organic thin films including a light-emitting layer;
   a first partition wall defining the anode and having an upper surface with liquid repellency;
   a second partition wall formed on the first partition wall, the second partition wall having an upper surface with liquid repellency and a narrower width than the first partition wall, wherein
   the functional layer is formed by forming each of the organic thin films by applying a liquid containing a functional layer-forming material on a film-forming region which is defined by a partition wall including the first partition wall and the second partition wall and then drying the liquid; and
   the cathode is formed on the functional layer.

6. A method for manufacturing an organic EL element including a functional layer disposed between an anode and a cathode on a substrate and including laminated different organic thin films including a light-emitting layer, the method comprising:
   forming a first partition wall which defines the anode and has an upper surface with liquid repellency;
   forming, on the first partition wall, a second partition wall which has an upper surface with liquid repellency and a narrower width than the first partition wall,
   forming the functional layer by forming each of the organic thin films by applying a liquid containing a functional layer-forming material on a film-forming region which is defined by a partition wall including the first partition wall and the second partition wall and then drying the liquid; and
   forming the cathode on the functional layer.

7. The method for manufacturing an organic EL element according to claim 6, wherein the second partition wall is formed by patterning the second partition wall on the first partition wall using a photosensitive resin material and transferring a liquid-repellency layer to the upper surface of the second partition wall.

8. The method for manufacturing an organic EL element according to claim 6, wherein the first partition walls are formed inside and outside of a structure to hold the structure therebetween, the structure being provided to surround the periphery of the anode on the substrate, and the second partition wall is formed on the structure.

9. The method for manufacturing an organic EL element according to claim 6,
   wherein each of the first partition wall and the second partition wall is formed by forming a coating film on the substrate using a photosensitive resin material containing a liquid-repellent agent, heat-treating the coating film, and then patterning the heat-treated coating film.

10. The method for manufacturing an organic EL element according to claim 9, wherein the first partition wall is formed using the coating film containing the liquid-repellent agent in an amount smaller than that of the second partition wall.

* * * * *